United States Patent [19]
Iwata et al.

[11] Patent Number: 5,652,729
[45] Date of Patent: Jul. 29, 1997

[54] SEMICONDUCTOR INTEGRATED CIRCUIT APPARATUS AND METHOD OF ADJUSTING REFRESH TIMER CYCLE

[75] Inventors: Toru Iwata; Hiroyuki Yamauchi, both of Osaka, Japan

[73] Assignee: Matsushita Electric Industrial Co., Ltd., Osaka, Japan

[21] Appl. No.: 597,256

[22] Filed: Feb. 6, 1996

[30] Foreign Application Priority Data

Feb. 8, 1995 [JP] Japan .................................. 7-020545

[51] Int. Cl.$^6$ .................................................. G11C 13/00
[52] U.S. Cl. ........................................... 365/222; 365/149
[58] Field of Search .................................... 365/149, 222, 365/210, 225.7

[56] References Cited

U.S. PATENT DOCUMENTS

| | | | |
|---|---|---|---|
| 4,905,198 | 2/1990 | Oishi | 365/222 |
| 4,939,695 | 7/1990 | Isobe | 365/222 |
| 5,392,251 | 2/1995 | Manning | 365/222 |

FOREIGN PATENT DOCUMENTS

| | | |
|---|---|---|
| 4-344387 | of 0000 | Japan . |
| 4-259983 | 9/1992 | Japan . |
| 5-225777 | 9/1993 | Japan . |

*Primary Examiner*—A. Zarabian
*Attorney, Agent, or Firm*—McDermott, Will & Emery

[57] ABSTRACT

A semiconductor Integrated circuit apparatus that has memory cell array, and a refresh timer which outputs a refresh signal for holding data of the memory cell array. The apparatus also has a leak monitoring circuit for detecting a voltage drop associated with a leak current from the memory cell array of a main memory, and a pulse generating circuit for outputting the refresh signal. The leak monitoring circuit is formed by a dummy memory cell array, which is formed by memory cells having the same structure as the memory cells of the main memory, a potential comparator for comparing a potential which is outputted from the dummy memory cell array with a predetermined potential, and leak accelerating means for accelerating the potential decrease speed of the dummy memory cell array.

45 Claims, 20 Drawing Sheets

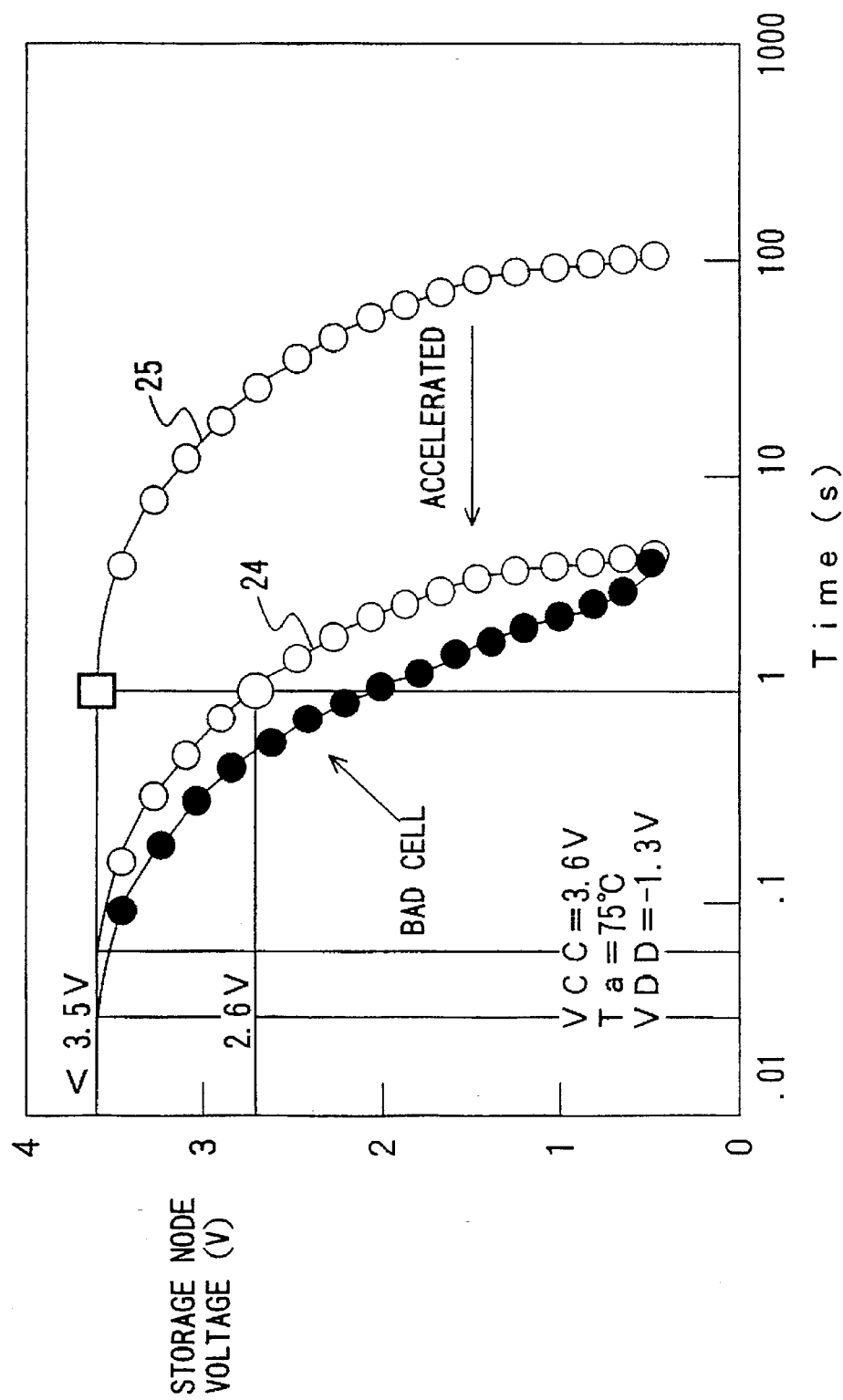

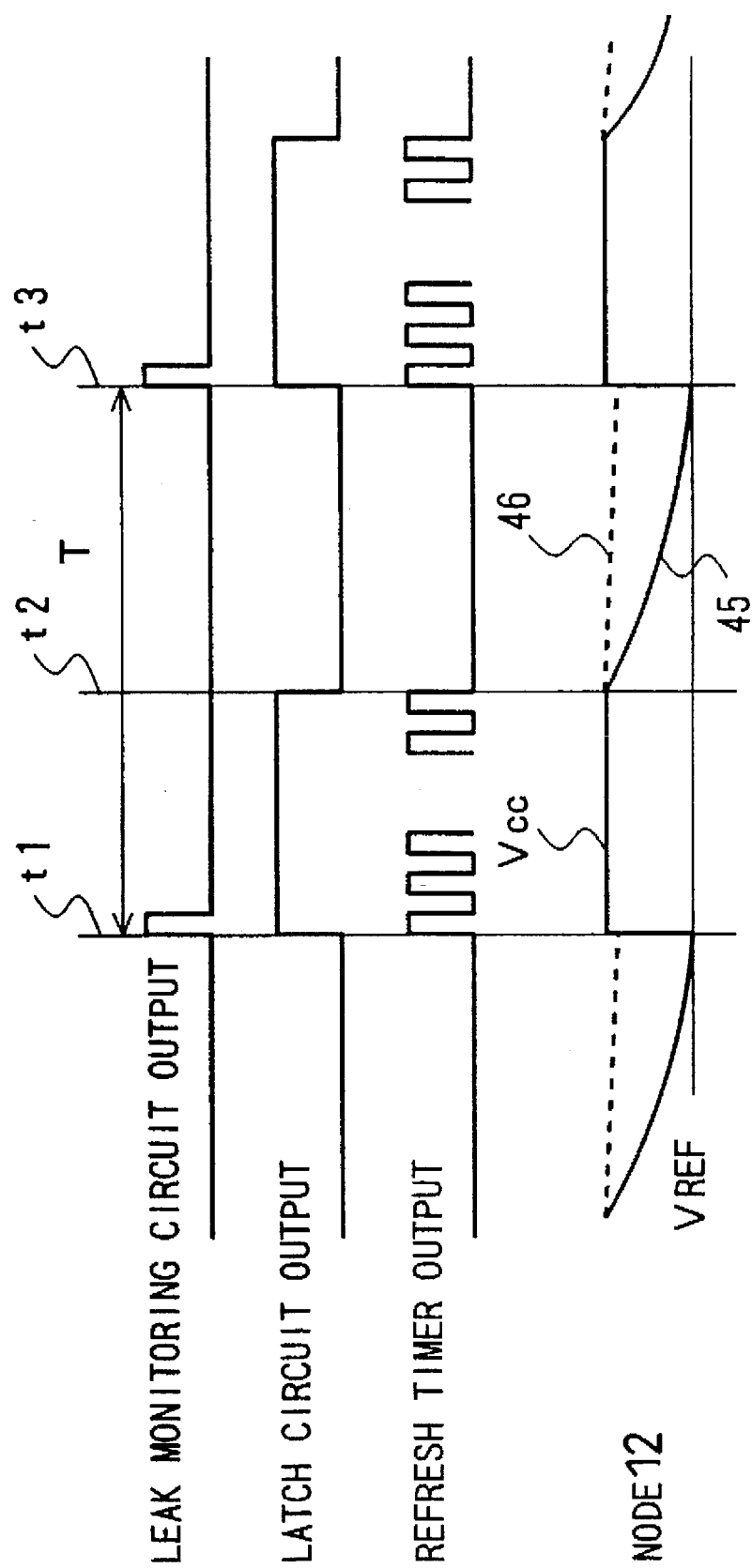

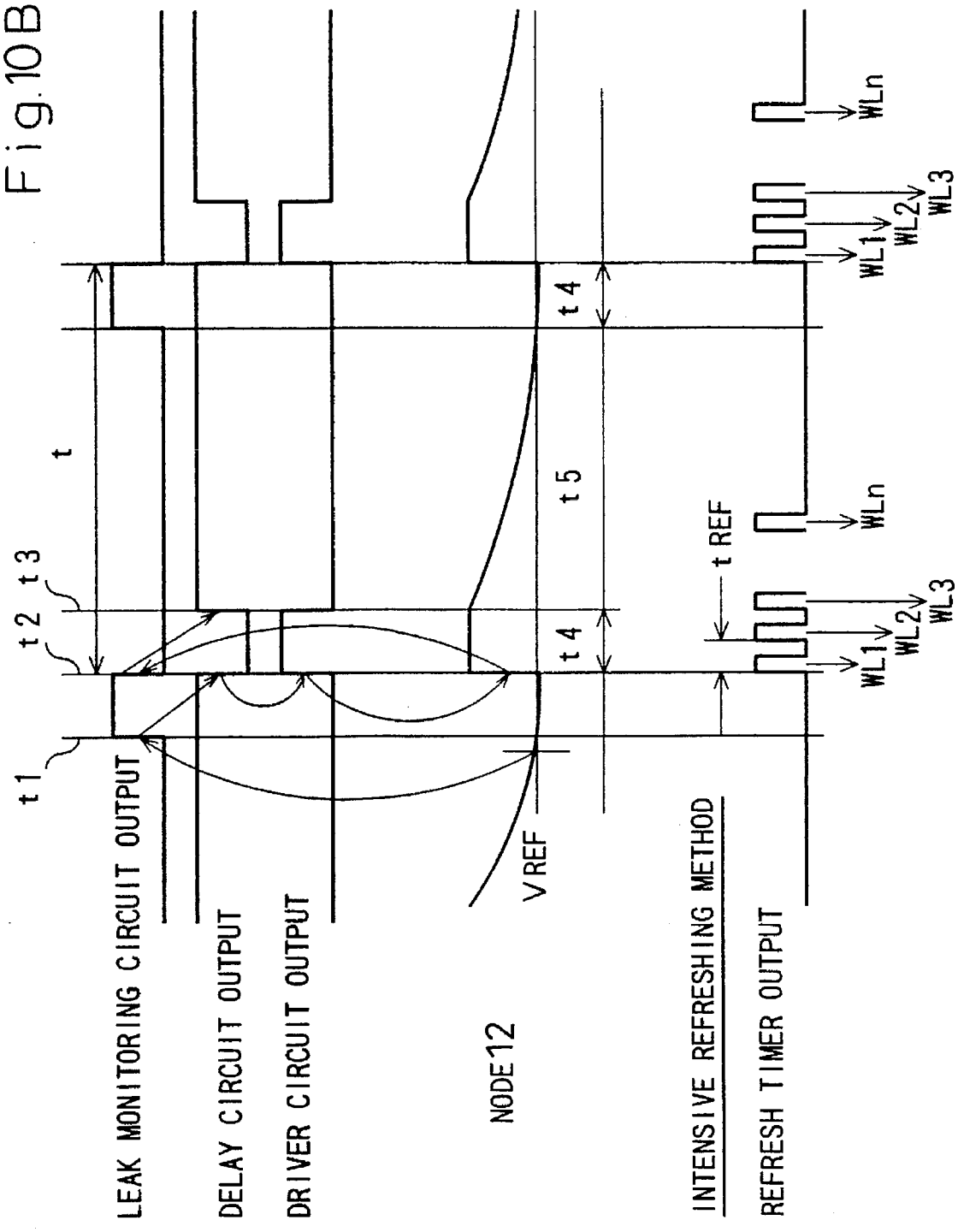

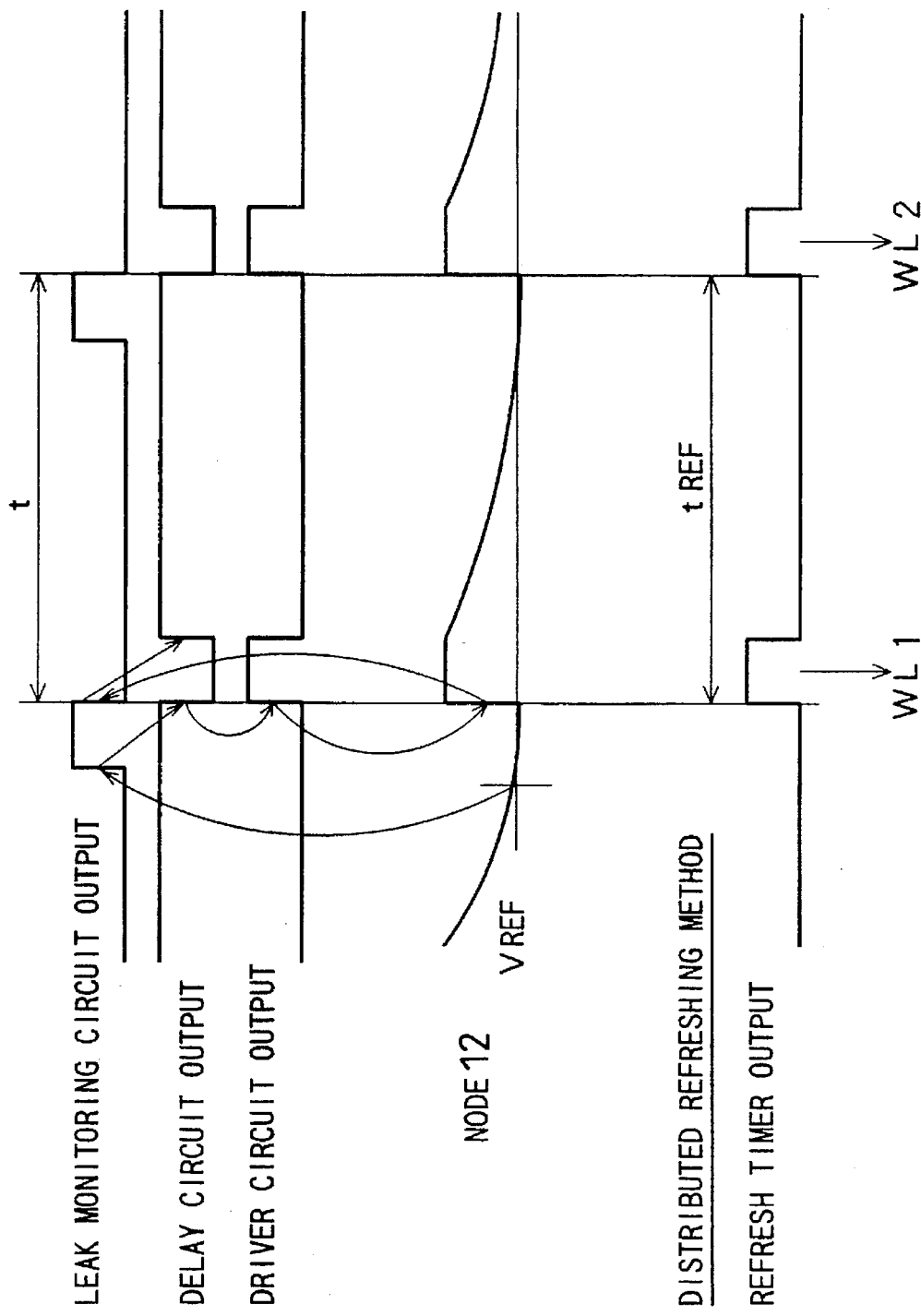

PROIR ART

SEMICONDUCTOR INTEGRATED CIRCUIT APPARATUS AND METHOD OF ADJUSTING REFRESH TIMER CYCLE

BACKGROUND OF THE INVENTION

The present invention relates to a semiconductor integrated circuit, such as a DRAM and a pseudo SRAM, which comprises a refresh timer which generates a refresh signal for performing refreshing, and to a method of adjusting a cycle of the refresh timer. More particularly, the present invention relates to measures to reduce a consumption current which is associated with refreshing.

In recent years, spread of portable information telecommunication equipment has made it increasingly necessary to reduce a consumption current of a memory such as a DRAM. A DRAM, in particular, creates a consumption current associated with refreshing even during holding of data, and therefore, a reduction in a consumption current during holding of data is becoming an important task.

As shown in FIG. 14, a data holding time exhibits a temperature-dependency in a memory cell of a DRAM. As the temperature increases, a data holding time becomes shorter. To be specific, when a power source potential $V_{CC}$ is 3.6 V, each temperature increase of 10 degrees centigrade shortens a data holding time approximately by $1/1.5$. A data holding time at the temperature of 75 degrees centigrade is only $1/10$ of that at the temperature of 25 degrees centigrade. Considering this, in a DRAM which has a self-refreshing mode, to guarantee holding of data at a high temperature, a refreshing cycle is set extremely short to deal with a data holding time at a high temperature. Since this requires such a DRAM to perform refreshing more frequently than needed when the DRAM is used at a normal or a low temperature, the DR accordingly consumes a current more than needed.

Now, a description will be given on a technique which is disclosed in ISSCC Digest of Technical Papers, pp. 268–269, Feb. 1991 to reduce a refresh current at a low temperature by constructing a refresh timer which outputs a refresh signal to have a temperature-dependency so that a refreshing cycle becomes longer at a low temperature than at a high temperature.

A cause of a limit on a data holding time is a leak current which is generated at a PN junction in a memory cell transistor, both in a case shown in FIG. 15A where the transistor is an NMOS transistor and in a case shown in FIG. 15B where the transistor is a PMOS transistor.

Since the temperature-dependency of a data holding time is attributed to the temperature-dependency of a leak current at a PN junction, a temperature characteristic of a refresh timer may be matched to a temperature characteristic of a memory cell leak. Hence, in general, to ensure that refreshing intervals exhibit a temperature characteristic which is similar to that of a memory cell leak, the refreshing intervals of the refresh timer are controlled utilizing a leak speed of a memory cell.

In the following, one example of a circuitry diagram of a refresh timer which utilizes a leak speed of a conventional memory cell will be described with reference to FIG. 16.

As shown in FIG. 16, since the capacitance of one memory cell capacitor 203 is very small, to avoid an influence by an input capacitance of a potential comparing circuit 206, a noise, etc., about 1,000 memory cells are connected parallel to each other to form a memory cell block 201 which serves as a dummy of a main memory. That is, storage nodes 204 are linked to each other by wires and so are cell plate nodes 205, which connects all capacitors 203 parallel to each other. A change in a potential at any storage node 204 is supplied to the potential comparing circuit 206 and compared therein with a reference potential $V_{REF}$. In general, the layout of the memory cell block 201 is designed as a refresh circuit, separately from that of the main memory.

Now, a circuitry operation of the refresh timer having such a structure as above will be described.

First, while the storage node 204 is charge up to a power source potential $V_{CC}$ through memory cell transistors 202 as shown in FIG. 16, in a timer circuit 208, an oscillation circuit 209 outputs an oscillation signal which serves as a refresh signal to an output terminal OUT, so that the main memory is refreshed in response to the oscillation signal. A counter circuit 210 counts the number of oscillations of the oscillation signal. When the number of oscillations reaches a count which is necessary to refresh all cells of the main memory, the counter circuit 210 outputs a signal to reset a latch circuit 207, thereby suspending oscillation of the oscillation circuit 209 (suspend of refreshing).

Next, when the latch circuit 207 is reset, the memory cell transistors 202 are turned off to separate the storage nodes 204 from a power source. As a result, charges held at the storage nodes 204 gradually decrease because of a leak at PN junctions at the memory cell transistors 202, so that potentials at the storage nodes 204 decrease.

Following this, the potential comparing circuit 206 sets the latch circuit 207 when the potentials at the storage nodes 204 drop down to the reference potential $V_{REF}$. When the latch circuit 207 outputs a signal, the timer circuit 208 is reset to allow the oscillation circuit 209 to oscillate again, whereby the counter circuit 210 starts counting the number of oscillations again (start of refreshing). Meanwhile, when the latch circuit 207 outputs a signal, the memory cell transistors 202 are turned on to charge up the storage nodes 204 to the power source potential $V_{CC}$ once again. In this manner, a refreshing period and a refreshing suspend period are repeated alternately.

As described earlier, the refreshing suspend period is defined by a time which is necessary for a potential at the storage node 04 to drop from the power source potential $V_{CC}$ to the reference potential $V_{REF}$. The storage nodes 204 are designed to exhibit a potential decrease speed which is approximately the same as the potential decrease speed of the main memory and a temperature characteristic which is approximately the same as that of the main memory during a drop. Hence, in this circuit, it is possible to set an optimal refreshing suspend period, i.e., optimal refreshing intervals, regardless of a temperature change.

By the way, since not all memory cells have the same data holding time, in the memory cell as a whole, a period during which refreshing is necessary must be defined by a memory cell which has the shortest data holding time. However, between the memory cell which has the shortest data holding time and a memory cell which has an average data holding time is different by about 30 times. FIG. 17 shows a result of measurement of a data holding time of a DRAM memory cell, with the power source potential $V_{CC}$ of 3.6 V and an ambient temperature of 75 degrees centigrade. As can be understood from FIG. 17, while memory cells having a short data holding time form a group, these cells account for only about 0.1% of all memory cells. Further, where a number of memory cells are connected parallel to each other so that the decrease speeds of potentials at the storage nodes are averaged as in the refresh timer described with reference to FIG. 16, even when the memory cell which has the shortest data holding time needs be refreshed, potentials at the storage nodes 204 do not decrease almost at all since the potentials at the storage nodes 204 are averaged in the refresh timer. For example, when the power source potential $V_{CC}$ is 5 V, the potentials at the storage nodes 204 are about 4.95 V, showing an extremely moderate decrease. Hence, the timing of the start of a refreshing period must be very susceptible even to a subtle change in the reference potential $V_{REF}$, which makes it difficult to set optimal refreshing intervals.

A countermeasure to deal with this is to quickly decrease potentials at the storage nodes to the reference potential $V_{REF}$. Proposals heretofore made include to ensure quick disappearance of charges in the storage nodes by setting the capacitance of the memory cell capacitor about 1/10 of the capacitance of the main memory as described in Laid Open unexamined Japanese Patent Application No. 4-259983, and to form a highly doped region in a substrate portion of the dummy memory cell to reduce an electric resistance value at the PN Junction of the transistor and to eventually increase a leak current by 1- or 1.5-order, as disclosed in Laid Open unexamined Japanese Patent Application No. 5-225777.

However, a semiconductor integrated circuit apparatus which comprises such a conventional refresh timer circuit has the following problems. That is, where the capacitance of the memory cell plates is set as 1/10, it is difficult to use the memory cells of the main memory as they are as memory cells of the semiconductor integrated circuit apparatus, and it is necessary to manufacture memory cells separately from the memory cells of the main memory. Such a structure cannot be regarded as a real dummy any more since there is a difference in the temperature characteristic, and therefore, it is difficult to properly set the refreshing intervals.

On the other hand, to decrease an electric resistance value, manufacturing of the memory cells definitely needs a few more steps, which is undesirable in terms of a cost. Moreover, the quantities of leak currents tend to be different from each other, which is another inconvenience.

SUMMARY OF THE INVENTION

The present invention aims to solve all of the problems above by optimizing a refreshing cycle, and to reduce a refresh current at a low or a normal temperature within a DRAM or the like.

To attain the object above, in a structure according to the present invention, the capacitance of a capacitor in a memory cell is reduced so that a leak current characteristic based on a temperature characteristic of a main memory is easily attained and so that the decrease speed of a storage node potential becomes faster.

A semiconductor integrated circuit apparatus according to the present invention comprises: a memory cell array of a main memory which is formed by arranging memory cells, each formed by a capacitor and a transistor, the capacitor being formed by disposing a first electrode which serves as a storage node storing a charge and a second electrode which is connected to a cell plate in such a manner that the first electrode and the second electrode face each other, the transistor having a first electrode connected to the storage node, a second electrode connected to a first power source which supplies a charge to the first electrode of the capacitor, and a third electrode connected to a control line which controls the quantity of a charge at the capacitor; and a refresh timer which outputs a refresh signal for holding data in the memory cell array of the main memory, wherein the refresh timer is comprised of: leak monitoring means which detects a voltage drop associated with a leak current from the memory cell array; and pulse generating means which receives a detection signal outputted from the leak monitoring means and outputs the refresh signal while at the same time outputting a signal to control means which controls the leak monitoring means, the leak monitoring means comprises: a dummy memory cell array which is formed by arranging memory cells which have the same structure as the memory cells which form the memory cell array of the main memory, the memory cells of the dummy memory cell array each having the third electrode of the transistor connected to the control means, the dummy memory cell array creating a voltage drop associated with the leak current; potential comparing means which is connected to storage nodes or cell plates of the memory cells which form the dummy memory cell array, the potential comparing means comparing a potential generated by the dummy memory cell array with a predetermined potential and outputting a signal when the potential coincides with the predetermined potential; and leak accelerating means for accelerating a voltage drop within the memory cells which form the dummy memory cell array.

In the semiconductor integrated circuit apparatus, the leak monitoring means, including the memory cells having the same structure as that of the memory cells of the main memory, monitors a leak current without fail, and since use of the leak accelerating means for accelerating a voltage drop within the dummy memory cell array of the leak monitoring means makes it possible to quickly decrease potentials at the capacitors of the leak monitoring means, it is possible to optimize a refreshing cycle, and therefore, it is possible to reduce a refresh current at a low or a normal temperature within the main memory such as a DRAM.

In the semiconductor integrated circuit apparatus, the potential comparing means is preferably connected to the cell plates of the memory cells which form the dummy memory cell array. When such is conducted, even if there is no additional space in terms of layout to dispose the potential comparing means on the storage node side, it is possible to use memory cells which have the same structure as that of the memory cells of the main memory.

In the semiconductor integrated circuit apparatus, preferably, first leak accelerating means is electrically open to the cell plate of each memory cell of the dummy memory cell array.

Since this allows charges at electrodes of the opposing side to disappear naturally as potentials disappear from the storage nodes, charges at the storage nodes disappear without disturbed by a large resistance. Hence, after supply of charges to the storage nodes is stopped, charges quickly leak out through Junctions of the transistors, and therefore, potentials at the storage nodes rapidly decrease and become close to the potential decrease speed of the storage node at a memory cell which has the shortest data holding time. This makes it possible to optimize a refreshing cycle, and therefore, it is possible to reduce a refresh current at a low or a normal temperature within the main memory such as a DRAM.

Further, in the semiconductor integrated circuit apparatus, second leak accelerating means is preferably an auxiliary transistor having a first electrode connected to the cell plates of the memory cells which form the dummy memory cell array, a second electrode connected to a second power source, and a third electrode connected to the control means.

Since the nodes of the cell plate side are electrically open when the auxiliary transistor is turned off, during a decrease in potentials at the storage nodes, this structure creates an effect which is similar to that attained in the invention which uses the first leak accelerating means. In addition, a decrease in potentials at the nodes of the cell plate side due to a leak at a junction of the auxiliary transistor further accelerates the decrease in the potentials at the storage nodes. Conversely, when the auxiliary transistor is turned on during a decrease in the potentials at the storage nodes, a voltage fall at the storage nodes is suppressed, and therefore, the potential decrease speed is reduced. Hence, in response to turning on and off of the auxiliary transistor, not only the potential decrease speeds of the storage nodes are further accelerated than in the invention which uses the first leak accelerating means, but also the refreshing period is further optimized since an increase and a decrease of the potential decrease speeds of the storage nodes are controlled.

In addition, every time potentials at the storage nodes decrease to a predetermined potential and initialized to a first power source potential, the nodes of the cell plate side become a potential of the same direction as the first power source because of the second power source, and hence, imbalance is suppressed during an increase or a decrease of a potential between the first electrode and the second electrode of the capacitor. This avoids an inconvenience associated with the imbalance, such as destruction of a capacitor insulation film of the capacitor.

Where the first or the second leak accelerating means is used, the transistors of the memory cells are preferably N type MOS transistors, and the dummy memory cell array of the leak accelerating means is preferably connected to a voltage increasing power source supplying a potential which is higher than a potential which the first power source supplies to the memory cell array of the main memory.

Since this increases a potential difference between PN junctions of the N type MOS transistors, leaks at the junctions increase, which in turn further accelerates the potential decrease speeds of the storage nodes. Hence, a set margin of a reference potential $V_{REF}$ can be large, which stabilizes an operation of the apparatus.

In addition, in this case, the transistors of the memory cells are preferably N type MOS transistors, and in the leak accelerating means, substrates of N type MOS transistors of the dummy memory cell array are preferably connected to a voltage decreasing power source which supplies a potential which is lower than a potential which is supplied by the power source which is connected to the substrates of the N type MOS transistors of the memory cell array of the main memory.

Since tis increases a potential difference between PN junctions of the N type MOS transistors, leaks at the junctions increase, which in turn further accelerates the potential decrease speeds of the storage nodes. Hence, a set margin of a reference potential $V_{REF}$ can be large, which stabilizes an operation of the apparatus.

Further, in this case, at least one introductory capacitor, which has one electrode connected through a fuse and the other electrode grounded, is preferably connected to at least the storage nodes or the cell plates of the dummy memory cell array side, and the value of a capacitance coupled to the storage nodes is preferably adjusted every time the fuse is cut.

Since this allows the first power source to supply a charge to the storage nodes, so that a charge is supplied to the introductory capacitor which is disposed on the storage node side or the cell plate side through the fuse when potentials at the nodes of the storage node side or the cell plate side increase, the quantity of charges increases at the storage nodes by an amount which corresponds to the introductory capacitor. Hence, when the fuse is cut, the quantity of charges held at the storage node decreases by an amount which corresponds to the quantity of charges held at the introductory capacitor. Since the value of the capacitance coupled to the storage node is fine-adjusted to decrease by cutting the fuse, during manufacturing of the refresh timer, for example, it is possible to adjust lot by lot so as to reduce the value of the capacitance and to increase the potential decrease speed.

Further, in this case, the at least one introductory transistor, which has a first electrode connected through a fuse, a second electrode connected to the power source, and a third electrode connected to the control means, is preferably connected to at least the storage nodes or the cell plates of the dummy memory cells, and the speed at which a potential decreases at the storage node is preferably adjustable by cutting the fuse.

Since this ensures that a charge flows in the introductory transistor as well which is disposed on the storage node side or the cell plate side through the fuse during a fall in potentials at the storage nodes or the nodes of the cell plate side, junction leaks at the transistors increase by an amount corresponding to the introductory transistor. Hence, when the fuse is cut, the junction leak as a whole is reduced by the junction leaks at the introductory transistor. This makes it possible to fine-adjust the speed at which the storage node potential decreases to decrease, by cutting the fuse. Therefore, during manufacturing of the refresh time, for instance, it is possible to adjust lot by lot so as to reduce the potential decrease speed.

In the semiconductor integrated circuit apparatus described above, the pulse generating means is preferably connected to the potential comparing means and the control means, and preferably comprises signal latching means for holding a received signal and timer means which is connected to the signal latching means and which is formed by oscillating means for outputting pulses which serve as the refresh signal and a counter for counting pulses to a predetermined count.

This makes it possible to generate the refresh signal from the detection signal which is outputted from the leak monitoring means without fail.

In the semiconductor integrated circuit apparatus described above, the pulse generating means is preferably connected to the potential comparing means and the control means, and preferably comprises delay means for delaying the received signal.

This eliminates the necessity of disposing the oscillating means, the counter, etc., which in turn simplifies the structure of the apparatus.

In addition, since pulses synchronized to the detection signal which is outputted from the leak monitoring means are generated, the device is easily applicable to a distributed refreshing mode.

In the semiconductor integrated circuit apparatus described above, the pulse generating means preferably outputs all refresh signals, intensively during a part of a refreshing cycle period in which is a generation period for generating the detection signal. Since this ensures that the refresh signal is generated to each one of the memory cells of the main memory during the refreshing cycle period, refreshing is performed without fail.

In the semiconductor integrated circuit apparatus described above, the pulse generating means preferably has an additional structure for outputting the refresh signal which consists of one pulse which is synchronized to the generation period.

Since this allows the refresh signal, which consists of one pulse which is synchronized to the generation period for generating the detection signal which is outputted from the leak monitoring means, to successively select word lines one by one which are connected to the memory cell array of the main memory side so that refreshing is performed, intervals for sending the refresh signal are longer than in an intensive refreshing mode in which the refresh signal is intensively transmitted during a part of the refreshing cycle period. As a result, heat generation is suppressed during the circuit operation, thereby stabilizing an operation of the apparatus.

A first refresh timer cycle adjusting method according to the present invention comprises: a measuring step of measuring a cycle of a refresh timer which outputs a refresh signal for holding data in a memory cell array, the refresh timer comprising leak monitoring means which detects a voltage drop associated with a leak current in the memory cell array; an evaluating step of comparing a measurement with a predetermined target value which is set based on a standard value regarding a device which forms the memory cell array and for thereafter evaluating; and an adjusting step of adjusting refreshing cycle adjusting means when the measurement does not reach the target value which is set for evaluation.

In the refresh timer cycle adjusting method as above, after measuring the cycle of the refresh timer at the measuring step, the measurement is compared with the predetermined target value which is set based on the standard values regarding the devices at the evaluating step and then evaluated, and if the measurement does not reach the target value, the refreshing cycle adjusting means is adjusted at the adjusting step. This makes it possible to hold data even under the worst temperature condition, and at the same time to extend the refreshing cycle at a normal temperature or at a low temperature in accordance with holding characteristics of the memory cells, which in turn reduces a consumption current which is associated with refreshing at a normal temperature or at a low temperature.

A second refresh timer cycle adjusting method according to the present invention comprises: a preparation step of measuring a data holding time of a device which forms a memory cell array under a predetermined condition and for thereafter setting a target value from a measurement; a measuring step of measuring a cycle of a refresh timer which outputs a refresh signal for holding data in the memory cell array, under the same condition as at the preparation step, the refresh timer comprising leak monitoring means which detects a voltage drop associated with a leak current in the memory cell array; an evaluating step of comparing a predetermined target value with which is set at the preparation step a measurement which is obtained at the measuring step and for thereafter evaluating; and an adjusting step of adjusting refreshing cycle adjusting means when the measurement does not reach the target value which is set for evaluation.

In the refresh timer cycle adjusting method as above, the data holding time of each device which forms the memory cell array is measured under the predetermined condition at the preparation step, the target value is then set from a measurement, and after measuring the cycle of the refresh timer, which comprises the leak monitoring means detecting a voltage drop associated with a leak current in the memory cell array and which outputs the refresh signal for holding data in the memory cell array, under the same condition as at the preparation step, at the target value which is set at the preparation step is compared with the measurement which is obtained at the measuring step and evaluated at the evaluating step, followed by adjustment of the refreshing cycle adjusting means when the measurement does not reach the target value which is set for evaluation. Since this makes it possible to set an optimal refreshing cycle for each device regardless of the standard values set for the devices, a consumption current associated with refreshing at a normal temperature or at a low temperature is further reduced.

In addition, since the device which is to be used is actually measured at the preparation step, under the predetermined condition, at the measuring step, measuring may be performed under the same condition as at the preparation step. This eliminates the necessity to perform measuring under the worst temperature condition, which makes it easy to execute temperature management.

In the first or the second refresh timer cycle adjusting method, the adjusting step preferably comprises a step of repeating steps from the measuring step to the adjusting step until the target value is reached. This allows the refresh timer to have a desired refresh timer cycle, without fail.

Alternatively, in the first or the second refresh timer cycle adjusting method, the refreshing cycle adjusting means is preferably formed by connecting least one introductory capacitor, which has one electrode connected through a fuse and the other electrode grounded, to at least the storage nodes or the cell plates of the dummy memory cells, within the leak monitoring means which comprises dummy memory cells each formed by a capacitor and a transistor, the capacitor being formed by disposing a first electrode which serves as a storage node for accumulating a charge and a second electrode which is connected to a cell plate so that the electrodes face each other, the transistor being connected between the storage node and a power source which supplies a charge to the storage node and controlling the quantity of charges accumulated at the storage node, and an adjusting method performed at the adjusting step requires to cut the fuse.

Since a capacitive coupling is reduced when the fuse connected to the introductory capacitor is cut, it is possible to fine-adjust the potential decrease speeds of the storage nodes so that the speeds are accelerated. Hence, it is possible to perform adjustment lot by lot so that the capacitor value of the capacitor is reduced and the potential decrease speeds are increased, during manufacturing of the refresh timer, for instance.

Alternatively, in the first or the second refresh timer cycle adjusting method, the refreshing cycle adjusting means is preferably formed by connecting at least one introductory transistor to at least the storage nodes or the cell plates of the dummy memory cells, within the leak monitoring means which comprises dummy memory cells each formed by a capacitor and a transistor, the capacitor being formed by disposing a first electrode which serves as a storage node for accumulating a charge and a second electrode which is connected to a cell plate so that the electrodes face each other, the one introductory transistor having a first electrode connected through a fuse, a second electrode connected to the power source, and a third electrode connected to control means which controls the quantity of charges accumulated at the capacitor, the transistor being connected between the storage node and a power source which supplies a charge to the storage node and controlling the quantity of charges accumulated at the storage node, and an adjusting method performed at the adjusting step requires to cut the fuse.

Since this leads no leak current flowing from the introductory transistor when the fuse connected to the introductory transistor is cut, it is possible to fine-adjust the potential decrease speeds of the storage nodes so that the speeds are reduced. Hence, it is possible to perform adjustment lot by lot so that the potential decrease speeds are delayed, during manufacturing of the refresh timer, for instance.

DESCRIPTION OF THE DRAWINGS

FIG. 4 is a view showing measurements of the potential decrease speed of the leak monitoring circuit within the semiconductor integrated circuit apparatus according to the first preferred embodiment of the present invention and the potential decrease speed of the conventional leak monitoring circuit;

FIG. 9B is a timing chart of the refresh timer which is disposed in the semiconductor integrated circuit apparatus according to the third preferred embodiment of the present invention;

FIG. 10B is a timing chart of the refresh timer which is disposed in the semiconductor integrated circuit apparatus according to the fourth preferred embodiment of the present invention;

FIG. 11B is a timing chart of the refresh timer which is disposed in the semiconductor integrated circuit apparatus according to the first modification of the fourth preferred embodiment of the present invention;

DETAILED DESCRIPTION OF THE INVENTION

In the following, a first preferred embodiment of the present invention will be described with reference to the drawings.

(First Preferred Embodiment)

Figure 1:
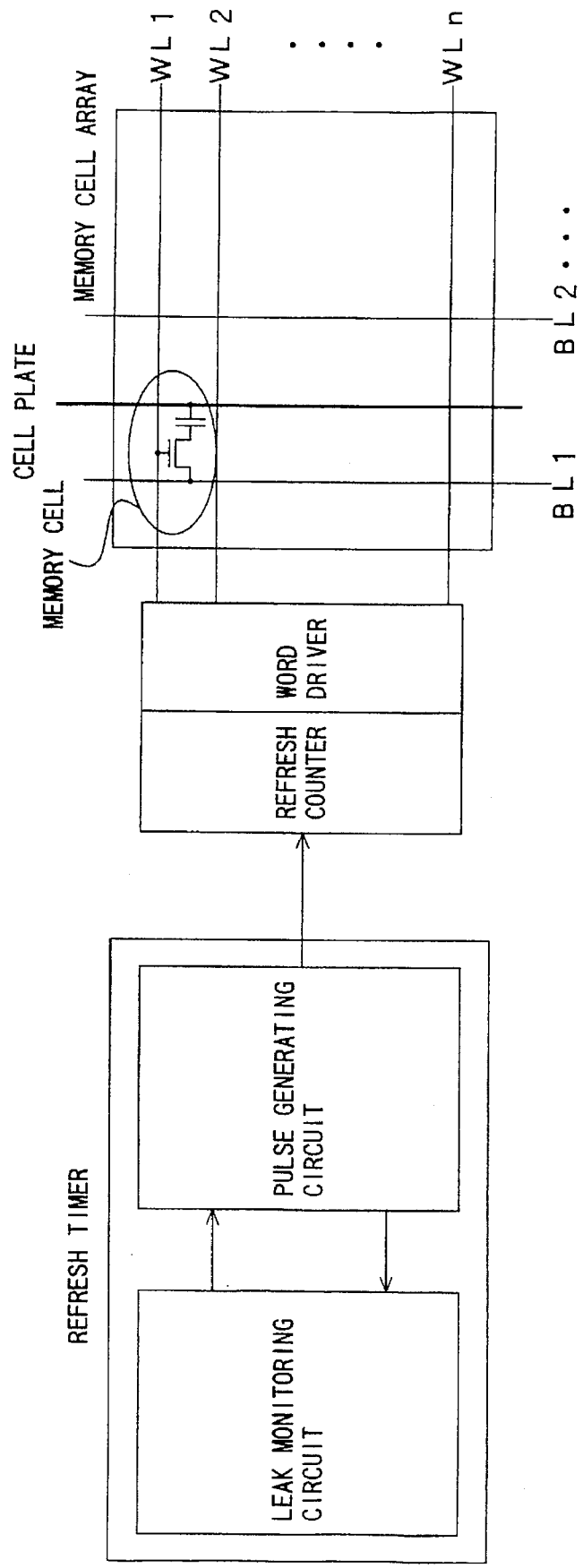
FIG. 1 is a view showing an overall structure of a semiconductor integrated circuit apparatus according to a first preferred embodiment of the present invention.

FIG. 1 is a view showing an overall structure of a semiconductor integrated circuit apparatus according to the first preferred embodiment of the present invention. In FIG. 1, a memory cell array which is formed by arranging memory cells, each formed by one capacitor and one transistor, periodically receives a refresh signal from a refresh timer, through a refresh counter and a word driver. The refresh timer is formed by a leak monitoring circuit, which includes memory cells having the same structure as that of the memory cells of the main memory, detects a fall in a potential at a storage node of a memory cell to a predetermined potential and informs a pulse generating circuit of this, and the pulse generating circuit which generates pulses which trigger the refresh signal. The word driver is connected to all word lines of the memory cell array. When a transistor which is connected to a successively selected one of the word lines (WLn) which is selected by the refresh counter is activated, a charge for holding data is supplied.

Figure 2A:
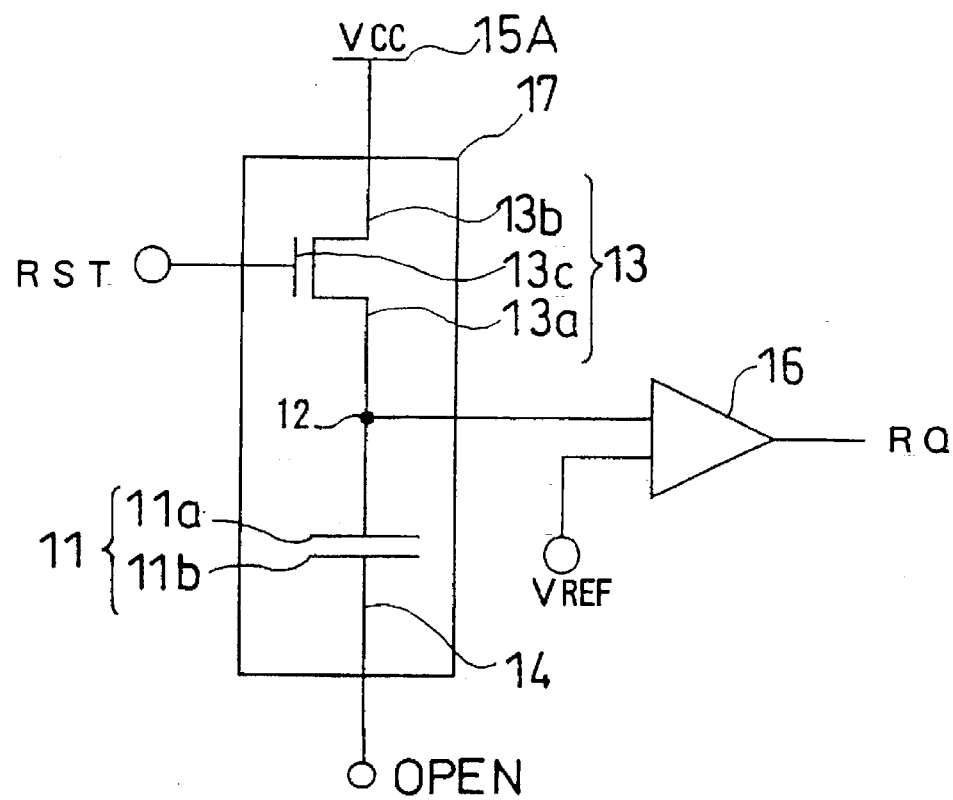
FIG. 2A is a circuitry diagram of a leak monitoring circuit of a refresh timer which is disposed in the semiconductor integrated circuit apparatus according to the first preferred embodiment of the present invention.

FIG. 2A is a circuitry diagram of the leak monitoring circuit of the refresh timer which is disposed in the semiconductor integrated circuit apparatus according to the first preferred embodiment of the present invention. As shown in FIG. 2A, the refresh timer is formed by: a capacitor 20 which is formed by disposing a first electrode 11a and a second electrode 11b; an NMOS transistor 13 which is formed by disposing a drain electrode 13a, which is connected to the first electrode 11a of the capacitor 11 to serve as a first electrode and to form a storage node 12 at which a charge is accumulated, a source electrode 13b, which serves as a second electrode connected to a first power source 15A (potential: $V_{CC}$) which supplies an accumulated charge to the storage node 12, and a gate electrode 13c, which serves as a third electrode connected to a control terminal RST which controls a current which flows between the drain electrode 13a and the source electrode 13b, all on a substrate; and a potential comparing circuit 16 which monitors a potential at the storage node 12 and functions as a refresh timer outputting a signal to a terminal RQ when a potential at the storage node 12 which is charged up to the potential $V_{CC}$ supplied from the power source through the transistor 13 decreases to a reference potential $V_{REF}$ because of a leak current from the transistor 13. This embodiment is characterized in that the second electrode 11b of the capacitor 11 forms a cell plate 14 and is electrically open.

Although not shown in the drawing, about 1,000 memory cells each consisted of the capacitor 11 and the transistor 13 are connected parallel to each other, thereby forming a dummy memory cell array 17.

Figure 2B:
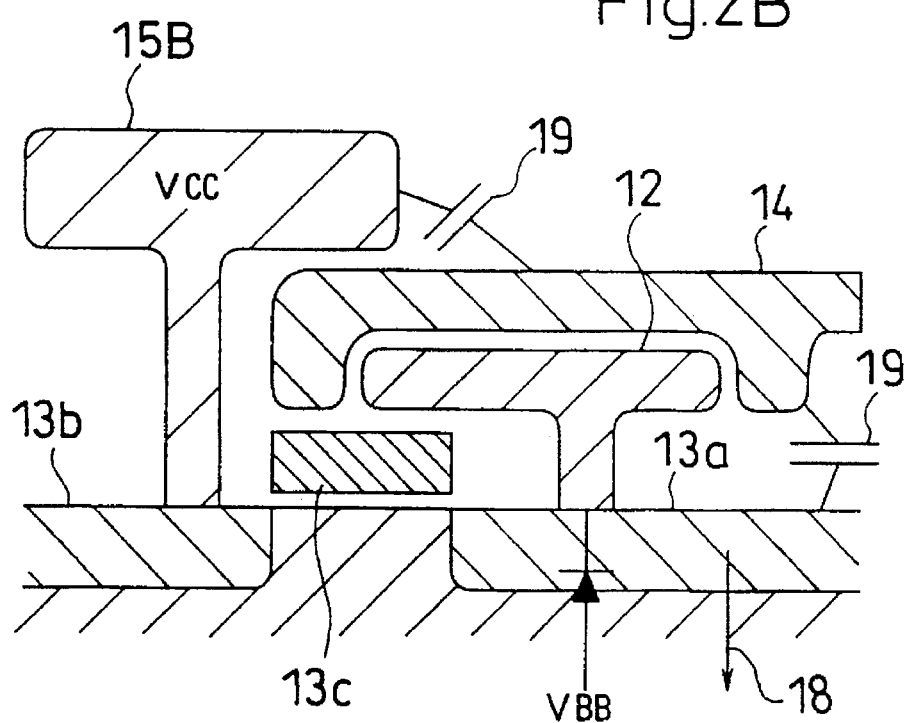
FIG. 2B is a schematic cross sectional view of the leak monitoring circuit of the refresh timer which is disposed in the semiconductor integrated circuit apparatus according to the first preferred embodiment of the present invention.

Now, an operation of the leak monitoring circuit constructed as above will be described with reference to FIGS. 2A and 2B. FIG. 2B is a schematic cross sectional view of the leak monitoring circuit. The same reference signs are assigned to the same elements which are shown in FIG. 2A, and a similar description will be omitted. First, when the control terminal RST is turned on, a predetermined voltage is applied to the gate electrode 13c of the transistor 13 and a charge is supplied to the storage node 12 through a bit line 15B, so that a potential at the storage node becomes the power source potential $V_{CC}$. Next, when the control terminal RST is turned off, a charge accumulated at the storage node 12 flows into the substrate as a leak current 18 mainly from the drain electrode of the transistor 13, and therefore, the potential at the storage node 12 gradually decreases. The potential comparing circuit 16 which is connected to the storage node 12 always monitors a potential at the storage node 12. When the potential at the storage node 12 decreases to the reference potential $V_{REF}$, the potential comparing circuit 16 outputs a detection signal.

Since the cell plate 14 is electrically open, and therefore since a parasitic capacitance 19 or the like which is coupled to the storage node 12 becomes comparatively small, the potential decrease speed of the storage node 12 is increased.

Now, a potential drop at the storage node 12 will be described.

First, it is assumed that the transistor 13 is turned on and a potential at the storage node 12 is $V_{CC}$. Next, the transistor 13 is turned off, whereby the storage node 12 becomes floating. Hence, a charge accumulated at the storage node 12 is lost, principally as a junction leak current associated with the transistor 13, and the potential at the storage node 12 decreases. The potential decrease speed of the storage node 12 is determined by a resistance value of a current leak path and capacitance values which are coupled to the storage node 12. The resistance value of the current leak path is changed by adjusting the size of the transistor 13. Meanwhile, the capacitance value is changed by adjusting the size of the capacitor 11 if a potential at the second electrode 11b of the capacitor 11 is fixed. However, since the sizes of the transistor 13 and the capacitor 11 are limited for convenience of the layout, the resistance value of the current leak path or a product of the capacitance values which are coupled to the storage node 12, i.e., the potential decrease speed of the storage node 12, cannot be set at a desired value in some cases.

Figure 16:
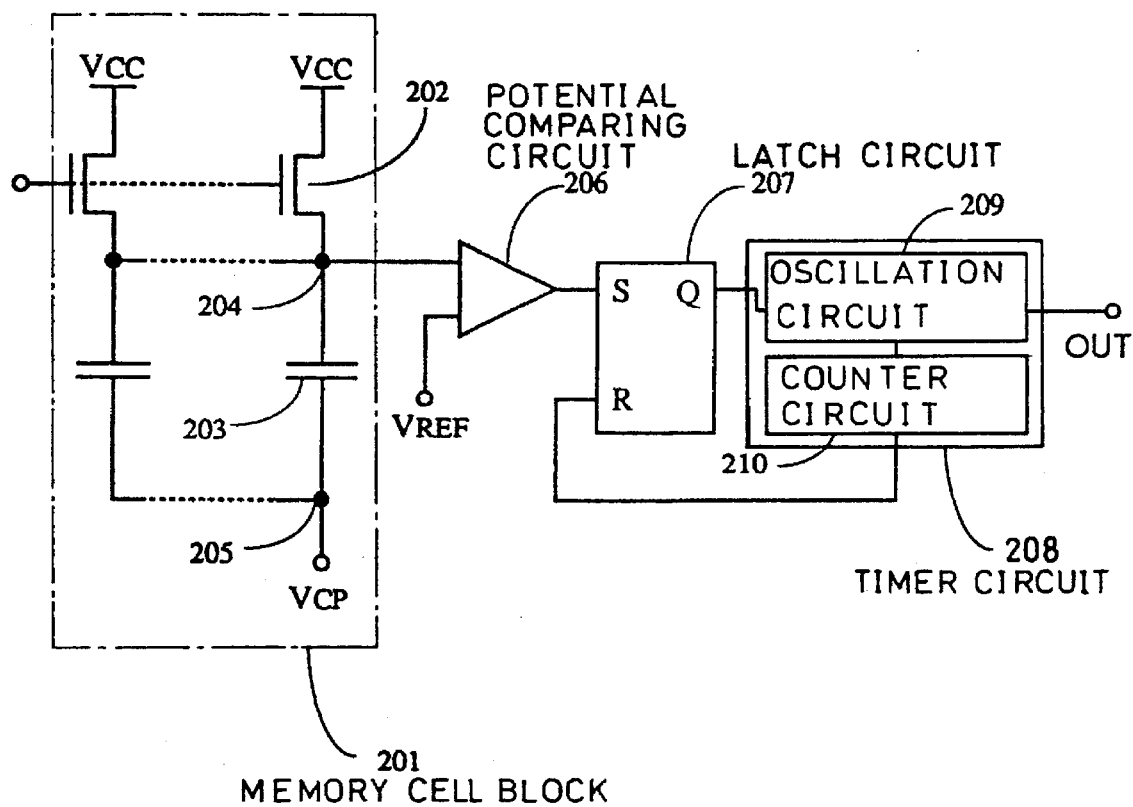
FIG. 16 is a circuitry diagram of the refresh timer which utilizes a leak speed of a conventional memory cell.
Figure 17:
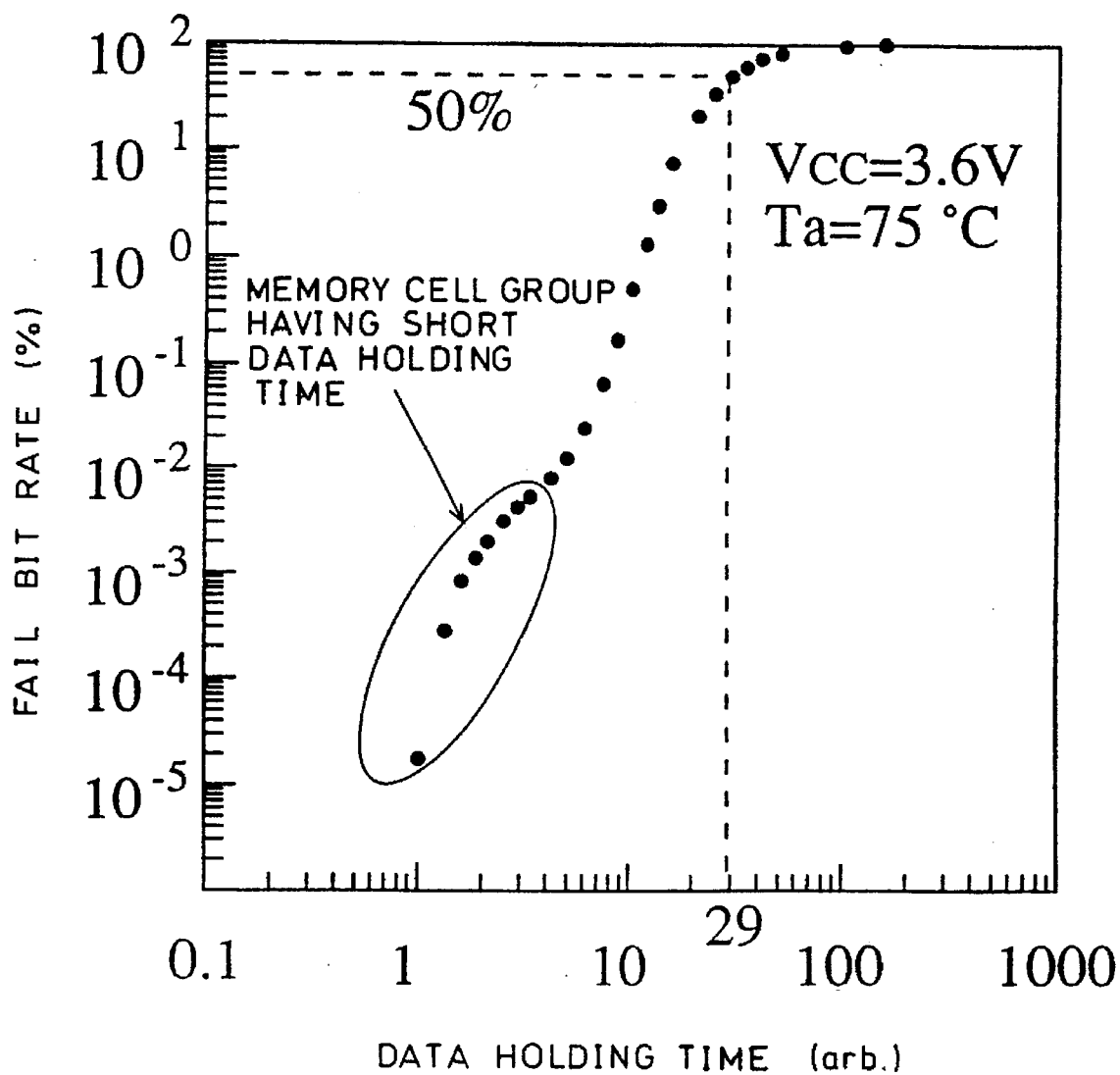
FIG. 17 is a view showing a data holding characteristic of a DRAM memory cell.

Next, a description will be given on a relationship between the potential decrease speed of the storage node and a refreshing cycle. A refreshing cycle which is needed to hold data of all memory cells of the main memory is defined by a memory cell which has the worst data holding characteristic. As shown in FIG. 16, a time during which the memory cell which has the worst data holding characteristic can hold data is different from a time during which 50% of the memory cells can hold data, by about 30 times. In a case where 1,000 memory cells are arranged as a block as shown in FIG. 2A, the potential decrease speed of the storage node 12 is an average value in the 1,000 memory cells, and therefore, is about 1/30 of the potential decrease speed of the storage node 12 of a memory cell which has the shortest data holding time. In short, even if there is a drop of only 1 V at the storage node 12 of the memory cell which has the shortest data holding time, a potential at the storage node 12 to which the dummy memory cell 17 is connected drops only by 0.03 V. Hence, a subtle change in the reference potential $V_{REF}$ even by only 0.01 V largely changes the timing at which the potential comparing circuit 16 outputs a signal.

Figure 3:
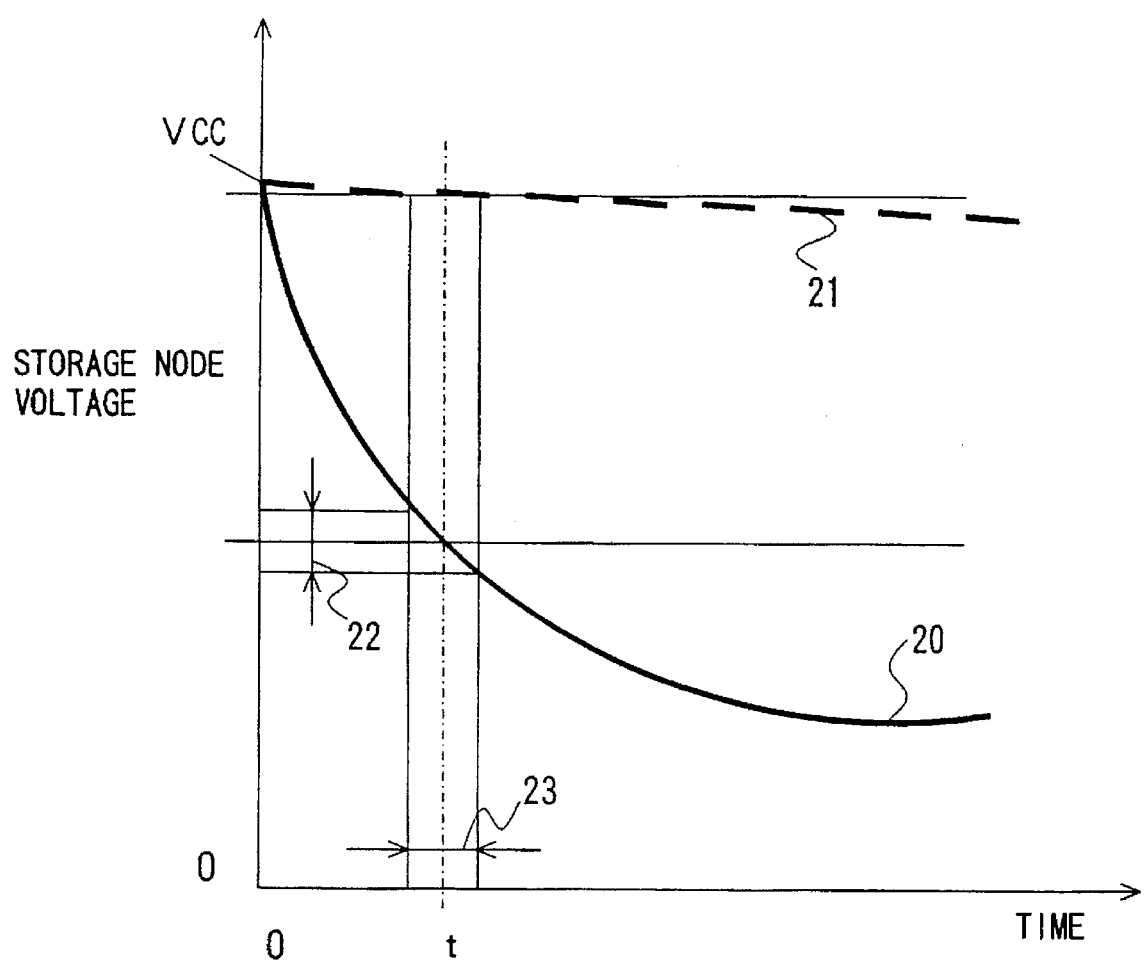
FIG. 3 is a view showing comparison between the potential decrease speed of the leak monitoring circuit within the semiconductor integrated circuit apparatus according to the first preferred embodiment of the present invention and the potential decrease speed of a conventional leak monitoring circuit.

FIG. 3 is a view showing comparison between the potential decrease speed of the leak monitoring circuit according to the present embodiment and the potential decrease speed of a conventional leak monitoring circuit. Changes in an elapsed time t and a storage node potential are shown, determining that a time at which the control terminal RST is turned off is t=0. As shown in FIG. 3, a solid line 20 denotes a change in a potential at the storage node according to the present embodiment, while a dotted line 21 denotes a change in a potential at a conventional storage node. Since the potential denoted by the dotted line 21 does not almost change at all at a predetermined time t, a set margin for the reference potential $V_{REF}$ cannot be set. On the other hand, since the potential decrease speed is increased in the present embodiment, a change in the storage node potential near the predetermined time t is larger than in the conventional example. This makes it possible to set the reference potential $V_{REF}$ to include a margin 22, and hence, to contain an error allowance range 23 of the refreshing cycle to a relatively narrow range.

As described earlier, to accelerate the potential decrease speed of the storage node 12 shown in FIG. 2A, the structure requires the cell plate nodes 12 to be connected by wires to each other within the dummy memory cell 17, and to float the nodes of the cell plate 14 side. Because of this, in a 16M-bit DRAM which is obtained by 0.5 μm process, a floating capacitance which is coupled to the storage node 12 is about 1/20 of the capacitance value of the capacitor 11, so that the potential decrease speed of the storage node 12 is accelerated by about 20 times.

FIG. 4 specifically shows an example of measurement. FIG. 4 shows a case where a 16M-bit test DR is taken as a sample, and the potential decrease speeds of the leak monitoring circuit according to the present embodiment and a conventional leak monitoring circuit are measured with a power source voltage $V_{CC}$ of 3.6 V, an ambient temperature of 75 degrees centigrade, a substrate potential $V_{BB}$ of −1.3 V. Changes in the elapsed time t and the storage node potential are shown, with turning off of the control terminal RST as a time t=0. In FIG. 4, a curve 24 denotes a change in the storage node potential while a curve 25 denotes a change in the potential at a conventional storage node. The curve 25 expressing the conventional potential change shows that the storage node potential exceeds 3.5 V after 1 second, and therefore, it is impossible to set the reference potential $V_{REF}$. In contrast, the curve 24 expressing the potential change according to the present embodiment shows that the storage node potential is down to 2.6 V after 1 second, and therefore, it is possible to set the reference potential $V_{REF}$. The curve 24 expressing the potential change according to the present embodiment also confirms that the potential decrease speed is close to that of the storage node of a bad cell which belongs to a memory cell group which is formed by a small number of memory cells having a bad holding characteristic.

Thus, according to the present embodiment, in the leak monitoring circuit of the refresh timer, since a potential at the storage node 12 can be decreased rapidly by electrically opening the node of the cell plate 14 side, the potential decrease speed is changed to be close to the potential decrease speed of the storage node potential of the memory cell which has the shortest data holding time. Hence, it is possible to set refreshing intervals in accordance with the data holding time. Since the refreshing cycle can be optimized, it is possible to reduce a refresh current at a low temperature or at a normal temperature in the semiconductor integrated circuit apparatus.

(First Modification of First Preferred Embodiment)

Now, a first modification of the first preferred embodiment of the present invention will be described in the following, with reference to the drawings.

Figure 5A:
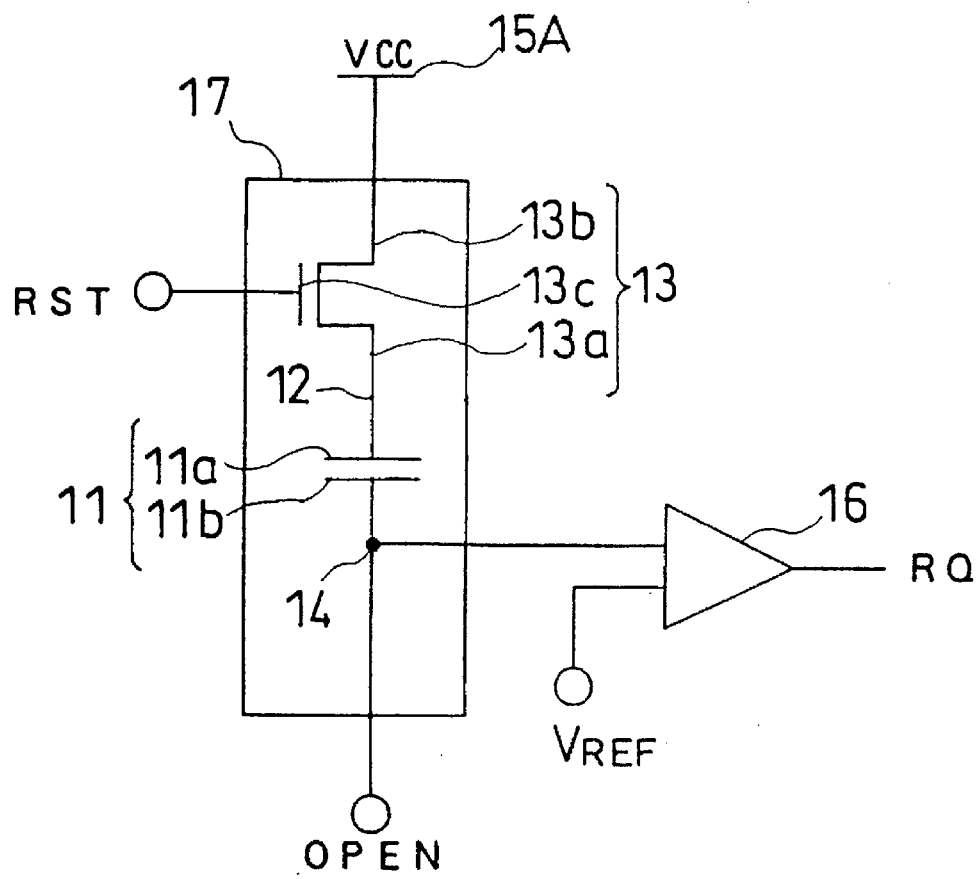
FIG. 5A is a circuitry diagram of a leak monitoring circuit of a refresh timer which is disposed in the semiconductor integrated circuit apparatus according to a first modification of the first preferred embodiment of the present invention.

FIG. 5A is a circuitry diagram of a leak monitoring circuit of a refresh timer which is disposed in the semiconductor integrated circuit apparatus according to the present modification. The same reference signs are assigned to the same elements which are shown in FIG. 2A, and a similar description will be omitted. To connect the storage nodes 12 of the memory cells forming the dummy memory cell array 17 of the first preferred embodiment, it is necessary to modify the shapes of the storage nodes 12. Hence, memory cells which are the same as the memory cells of the main memory cannot be used directly as they are. In addition, in the refresh timer according to the first preferred embodiment as well which is shown in FIGS. 2A and 2B, considering the layout, it may be very difficult in some cases to modify so as to lead the storage nodes 12 and connect the same to the potential comparing circuit 16.

According to the present modification, the potential comparing circuit 16 is connected to the second electrode 11b side of the capacitor 11, i.e., the cell plate 14 side, in order to monitor a potential at the second electrode 11b of the capacitor 11.

Figure 5B:
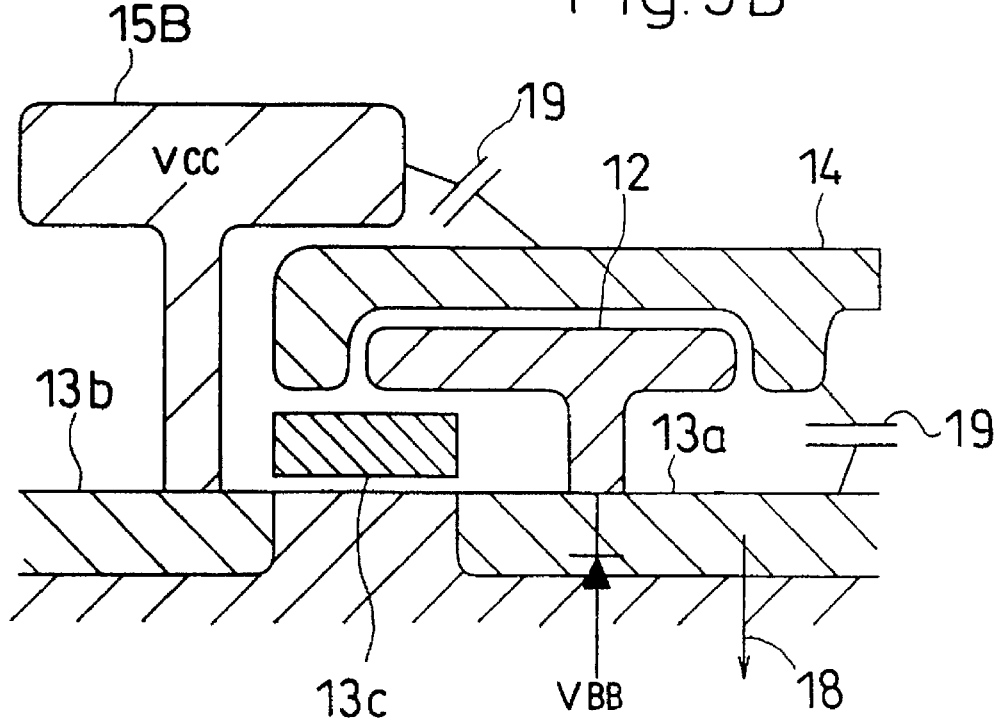
FIG. 5B is a schematic cross sectional view of the leak monitoring circuit apparatus of the refresh timer which is disposed in the semiconductor integrated circuit apparatus according to the first modification of the first preferred embodiment of the present invention.

In other words, even if the potential comparing circuit 16 monitors the cell plate 14, since a potential at the cell plate 14 decreases at the same speed as at the storage node 12, the potential comparing circuit 16 outputs a signal within a similar time as in monitoring of the storage node 12. Further, in the 16M-bit DRAM described above, the cell plate nodes 14 are connected by wires from the beginning. Therefore, it is easier to lead wires from the cell plates 14 and connect the wires to the potential comparing circuit 16, rather than to lead wires from the storage nodes 12 as shown in FIG. 5B.

Thus, according to the present modification, since the potential comparing circuit 16 is connected to the cell plates 14 to monitor potentials at the electrodes of the cell plates 14, even if there is no additional space in the layout to dispose the potential comparing circuits 16 on the storage node 12 side, memory cells which are the same as the memory cells of the main memory can be used.

(Second Modification of First Preferred Embodiment)

Now, a second modification of the first preferred embodiment of the present invention will be described in the following, with reference to the drawings.

Figure 6B:
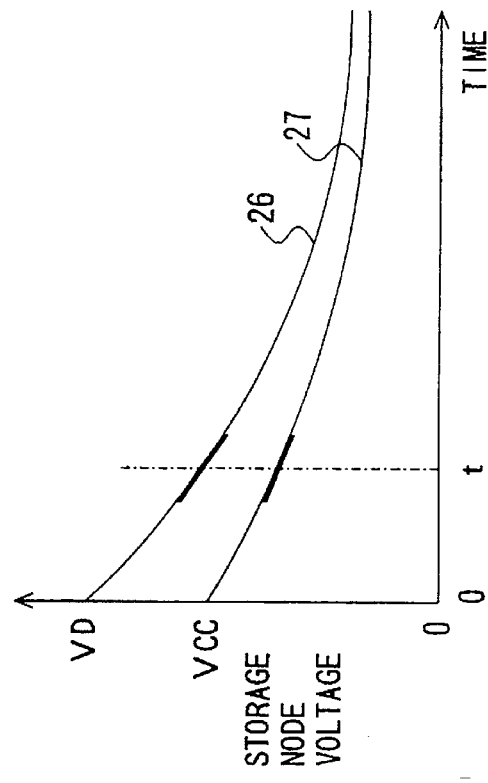
FIG. 6B is a view showing comparison between the potential decrease speed of the leak monitoring circuit within the semiconductor integrated circuit apparatus according to the second modification of the first preferred embodiment of the present invention and the potential decrease speed of the leak monitoring circuit within the semiconductor integrated circuit apparatus according the first preferred embodiment of the present invention.
Figure 6A:
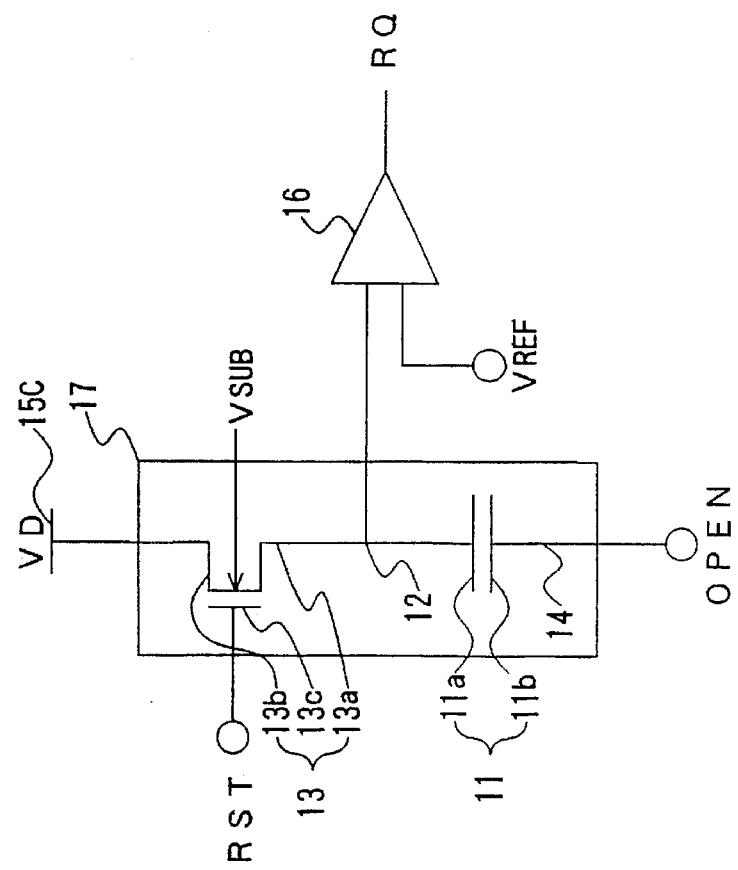
FIG. 6A is a circuitry diagram of a leak monitoring circuit of a refresh timer which is disposed in the semiconductor integrated circuit apparatus according to a second modification of the first preferred embodiment of the present invention.

FIG. 6A is a circuitry diagram of a leak monitoring circuit of a refresh timer which is disposed in the semiconductor integrated circuit apparatus according to the present modification. The same reference signs are assigned to the same elements which are shown in FIG. 2A, and a similar description will be omitted. In FIG. 6A, the source electrode 13b of the transistor 13 of a memory cell which forms the dummy memory cell array 17 is connected to a voltage increasing power source 15C (potential: $V_D$) which supplies a higher potential than the power source $V_{CC}$ which is connected to the second electrode of the transistor which forms the memory cell of the main memory. Meanwhile, on the substrate of the transistor 13, a voltage decreasing power source (potential: $V_{SUB}$) which supplies a lower potential than the power source which is connected to the substrate of the transistors of the memory cells of the main memory.

In the present modification, since a potential difference ($V_D$–$V_{SUB}$) which is applied to the PN junction of the transistor 13, i.e., an NMOS transistor, can be increased, a junction leak current is increased accordingly, thereby further accelerating the potential decrease speed of the storage node 12. FIG. 6B shows an example of measurement. FIG. 6B is a view showing the potential decrease speeds of the leak monitoring circuit according to the present modification and the leak monitoring circuit according to the first preferred embodiment. Changes in the elapsed time t and the storage node potential are shown, with turning off of the control terminal RST regarded as a time t=0. A curve 26 denoting the present modification exhibits a larger gradient of a change in the potential after the time t than the curve 27 which expresses the first preferred embodiment, and therefore, it is possible to set a large margin for the reference potential $V_{REF}$.

(Second Preferred Embodiment)

Now, a second preferred embodiment of the present invention will be described in the following, with reference to the drawings.

Figure 7:
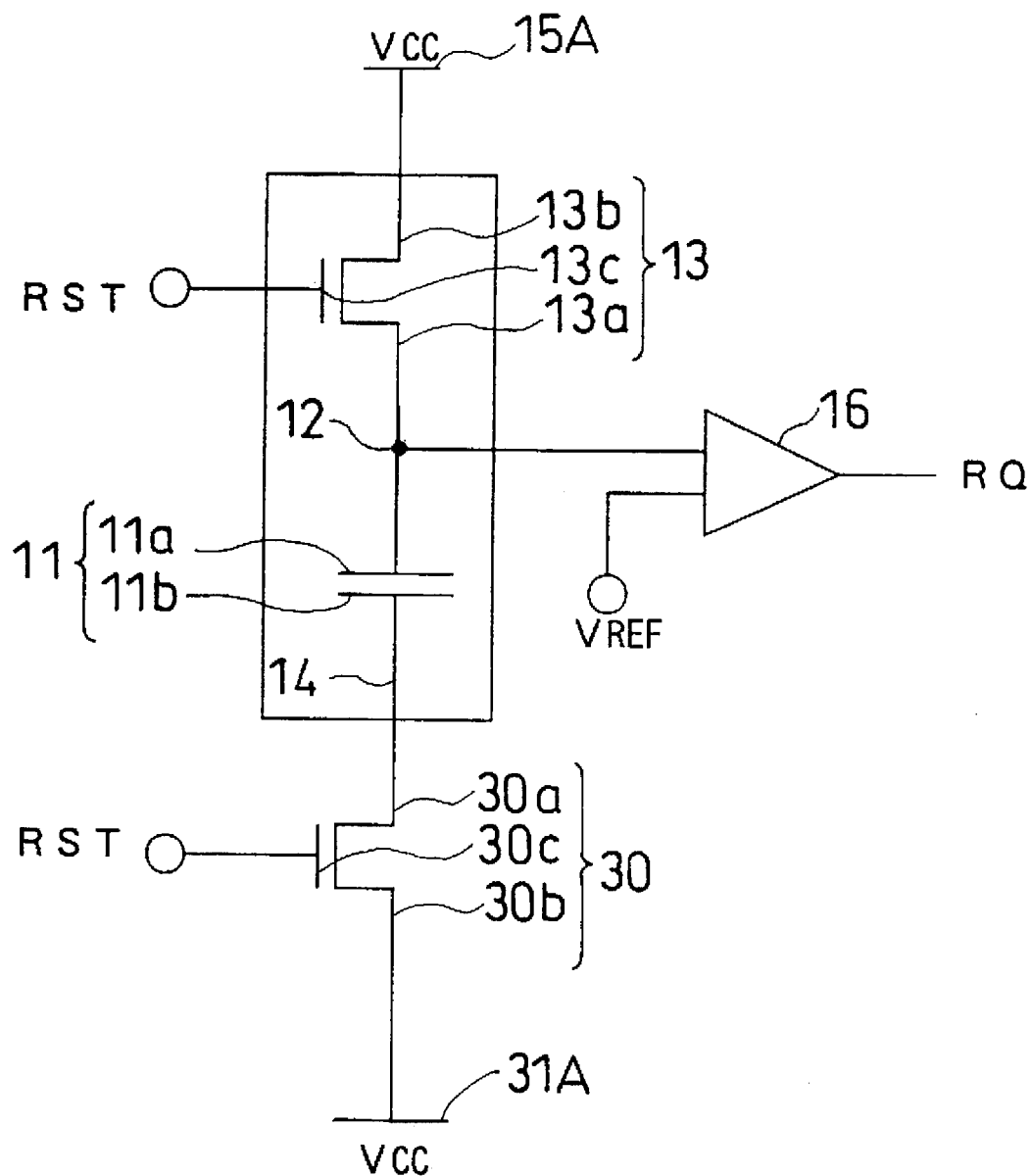
FIG. 7 is a circuitry diagram of a leak monitoring circuit of a refresh timer which is disposed in the semiconductor integrated circuit apparatus according to a second preferred embodiment of the present invention.

FIG. 7 is a circuitry diagram of a leak monitoring circuit of a refresh timer which is disposed in the semiconductor integrated circuit apparatus according to the second preferred embodiment of the present invention. The same reference signs are assigned to the same elements of the leak monitoring circuit of the first preferred embodiment which are shown in FIG. 2A, and a similar description will be omitted. In FIG. 7, when a potential at the storage node 12 changes, if coupling of the first electrode 11a and the second electrode 11b of the capacitor 11 during an increase in the potential is not electrically balanced with coupling during a decrease in the potential, as the storage node 12 is repeatedly charged up and discharged, a potential at the cell plate 14 keeps increasing or decreasing. Further, if a potential at the second electrode 11b of the cell plate 14 side keeps increasing or decreasing, there may be an adverse influence such as destruction of a capacitance insulation film of the capacitor 11.

The leak monitoring circuit according to the present embodiment is constructed so that the second electrode 11b of the capacitor 11 is connected to a second power source 31A (potential: $V_{CC}$) through an auxiliary transistor 30, which has a drain electrode, or a first electrode, 30a connected to the cell plate 14, a source electrode, or a second electrode, 30b connected to the second power source 31A and a gate electrode, or a third electrode 30c, connected to the control terminal RST. That is, the cell plate 14 is charged up to the potential $V_{CC}$ which is supplied from the second power source 31A during a period in which the transistor 13 is turned on to allow the storage node 12 to be connected to the potential $V_{CC}$ which is supplied from the first power source 15A, and before the transistor 13 is turned off so that a potential at the storage node 12 starts decreasing, the auxiliary transistor 30 is turned off to float the storage node 12.

In addition, there is a control circuit separately disposed which controls turning on and off of the auxiliary transistor 30 in such a manner that the potential decrease speed of the storage node 12 is changed in accordance with a control signal which turns on or off the transistor 13. This control circuit is designed so that it is possible to change the timing of turning on and off of the auxiliary transistor 30.

Hence, according to the present embodiment, the potential decrease speed of the storage node 12 is accelerated more than where a potential at cell plate 14 is fixed, which is similar to the first preferred embodiment. Further, since the cell plate 14 is charged up to the potential $V_{CC}$ supplied from the second power source 31A every cycle, there is no possibility that a potential at the cell plate 14 keeps increasing or decreasing. Still further, since a decrease in the potential at the cell plate 14 is further accelerated because of the junction leak current of the auxiliary transistor 30, the potential decrease speed of the storage node 12 is further accelerated than where the cell plate 14 is only electrically opened as in the first preferred embodiment.

Moreover, the potential decrease speed of the storage node 12 is not only increased due to turning on and off of the auxiliary transistor 30, but also is controlled by the control circuit. This optimizes the refreshing period. That is, when the auxiliary transistor 30 is turned off while a potential at the storage node 12 decreases, the potential decrease speed of the storage node 12 is further accelerated. Conversely, if the auxiliary transistor 30 is turned on, the potential decrease speed of the storage node 12 is reduced.

Although the foregoing has described that the auxiliary transistor 30 is turned off to float the cell plate 14 before turning on the transistor 18 in the leak monitoring circuit according to the second preferred embodiment, a potential at the cell plate 14 may be fixed at the potential $V_{CC}$ which is supplied from the second power source 31A until a potential at the storage node 12 decreases to a predetermined potential, so as not to accelerate the potential decrease speed of the storage node 12, and the auxiliary transistor 30 may be turned off to float the cell plate 14 after a potential at the storage node 12 decreases to the predetermined potential which is higher than the reference potential $V_{REF}$. If the potential decrease speed of the storage node 12 is accelerated in this manner, finer time setting is possible.

While the leak monitoring circuit according to the second preferred embodiment requires that the cell plate 14 to be connected to the potential $V_{CC}$ which is supplied from the second power source 81A through the auxiliary transistor 30, if the auxiliary transistor 30 is formed by an NMOS transistor, considering the quantity of a potential fall at the storage node 12, the power source voltage to be connected may be set within such a range which does not forwardly bias a junction of the NMOS transistor. One standard for setting the range is to set the potential of the second power source 31A equal to or larger than the sum ($V_{CC}+V_{BB}$) of the potential $V_{CC}$ of the first power source 15A and the substrate node potential $V_{BB}$ (minus potential) of the auxiliary transistor 30. Where the auxiliary transistor 30 is Formed by a PMOS transistor, it is not necessary at all to consider the power source voltage to be connected, as far as the power source voltage is within such a range which does not exert an adverse influence.

(First Modification of Second Preferred Embodiment)

Now, a first modification of the second preferred embodiment of the present invention will be described in the following, with reference to the drawings.

Figure 8:
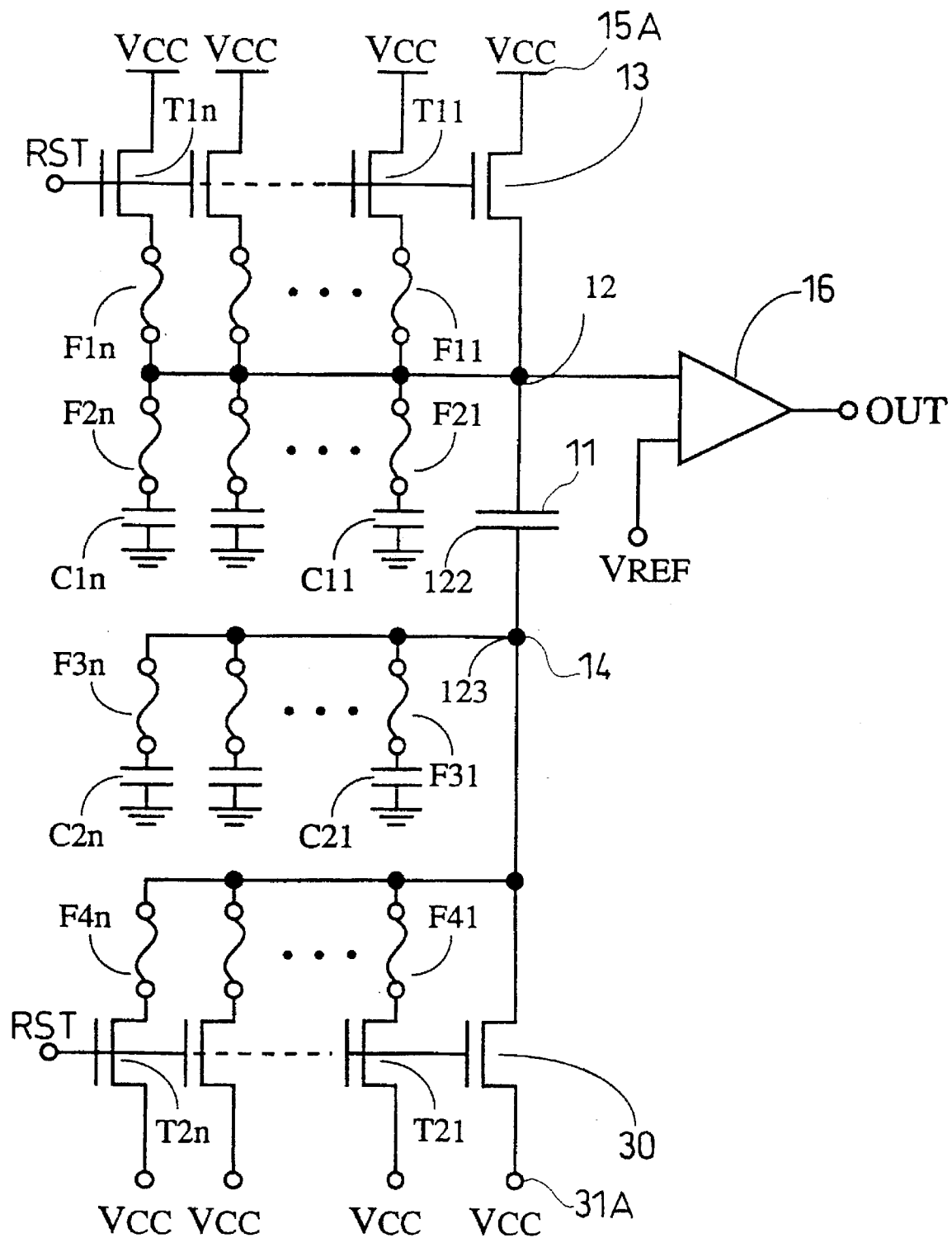
FIG. 8 is a circuitry diagram of a leak monitoring circuit of a refresh timer which is disposed in the semiconductor integrated circuit apparatus according to a first modification of the second preferred embodiment of the present invention.

FIG. 8 is a circuitry diagram of a leak monitoring circuit of a refresh timer which is disposed in the semiconductor integrated circuit apparatus according to the present modification. The same reference signs are assigned to the same elements which are shown in FIG. 7, and a similar description will be omitted.

As shown in FIG. 8, in the leak monitoring circuit according to the present modification, each electrode of one or more introductory capacitors C11 to C1n is connected to the storage node 12 in parallel through fuses F21 to F2n, respectively, while the other electrodes are grounded, and one or more introductory capacitors C21 to C2n are connected to the cell plate 14 in parallel through fuses F31 to F3n, respectively. A capacitance value coupled to the storage node 12 is adjustable to decrease, by cutting the fuses F21 to F2n or the fuses F31 to F3n.

In addition, drain electrodes of one or more introductory transistors T11 to T1n are each connected to the storage node 12 in parallel through Fuses F11 to F1n, respectively, source electrodes are each connected to the First power source 15A, while gate electrodes are connected to the control terminal RST, and drain electrodes of one or more introductory transistors T21 to T2n are each connected to the cell plate 14 in parallel through fuses F41 to F4n, respectively, source electrodes are each connected to the second power source 81A, and gate electrodes are each connected to the control terminal RST. The quantity of a leak current flowing From the storage node 12 is adjustable to decrease, by cutting the fuses F11 to F1n or the fuses F41 to F4n.

As described before, the potential decrease speed of the storage node 12 is defined by a floating capacitance which is coupled to the storage node 12, a leak current of the transistor 13, and if the auxiliary transistor 30 is disposed, also by a leak current of the auxiliary transistor 30.

Hence, to accelerate the potential decrease speed of the storage node 12, it is necessary to reduce the floating capacitance which is coupled to the storage node 12, or to increase the leak current of the transistor 13 or the auxiliary transistor 30. Conversely, to reduce the potential decrease speed of the storage node 12, it is necessary to increase the floating capacitance which is coupled to the storage node 12, or to decrease the leak current of the transistor 13 or the auxiliary transistor 30.

When the device is constructed to have a structure which requires the introductory capacitors C11 to C1n to be connected to the storage node 12 through the fuses F21 to F2n, respectively, and the introductory capacitors C21 to C2n to be connected to the cell plate 14 through the fuses F31 to F3n, respectively, to adjust the floating capacitance which is coupled to the storage node 12 so that the floating capacitance becomes smaller, by appropriately cutting some of the fuses F21 to F2n or the fuses F31 to F3n, it is possible to reduce a capacitance value which is coupled to the storage node 12. Of course, the introductory capacitors C11 to C1n and C21 to C2n may be disposed only on one side of the storage node 12 or the cell plate 14.

When the device is constructed to have a structure which requires the introductory transistors T11 to T1n to be connected to the storage node 12 through fuses F11 to F1n, respectively, and the introductory transistors T21 to T2n to be connected to the cell plate 14 through the fuses F41 to F4n, respectively, to reduce the leak current of the transistor 13 and the auxiliary transistor 30, by appropriately cutting some of the fuses F11 to F1n and the fuses F41 to F4n, it is possible to reduce a current which leaks from the storage node 12. Of course, the introductory transistors T11 to T1n and T21 to T2n may be disposed only on one side of the storage node 12 or the cell plate 14.

For example, to accelerate the potential decrease speed of the storage node 12, some of the fuses F21 to F2n or the fuses F31 to F3n, which connect the introductory capacitors C11 to C1n and C21 to C2n, may be appropriately cut. When some of the fuses are cut, the fuses F11 to F1n and F41 to F4n connecting the introductory transistors T11 to T1n and T21 to T2n may not be cut, but rather may be left as they are.

Thus, according to the present modification, it is possible to adjust the potential decrease speed of the storage node 12 so that the potential speed becomes faster, by cutting the fuses F21 to F2n or the fuses F31 to F3n of the introductory capacitors C11 to C1n and C21 to C2n. Conversely, it is possible to adjust the potential decrease speed so that the potential speed becomes slower, by cutting some of the fuses F11 to F1n and F41 to F4n of the introductory transistors T11 to T1n and T21 to T2n.

(Third Preferred Embodiment)

Now, a third preferred embodiment of the present invention will be described in the following, with reference to the drawings.

Figure 9A:
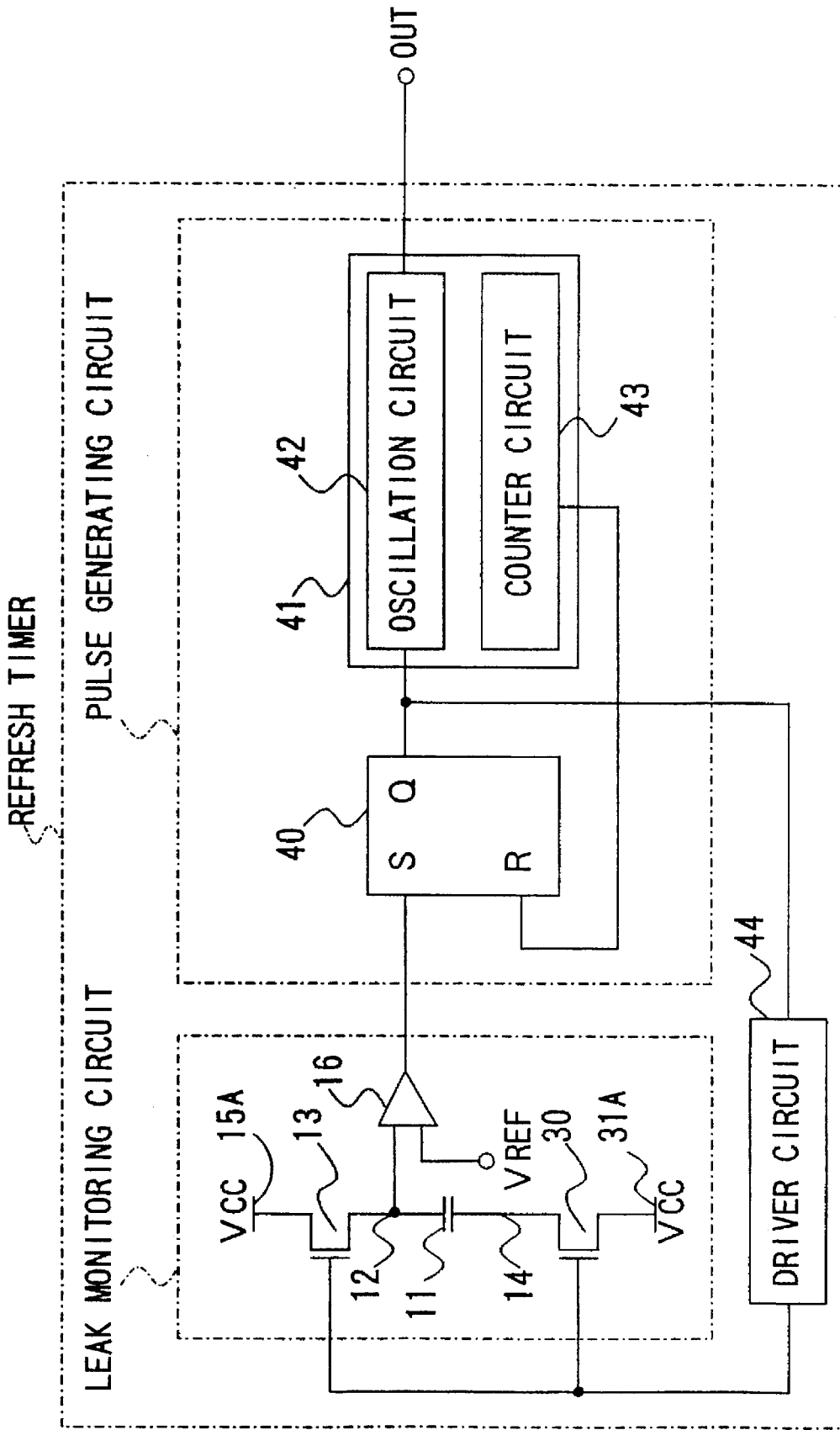
FIG. 9A is a circuitry diagram of a refresh timer which is disposed in the semiconductor integrated circuit apparatus according to a third preferred embodiment of the present invention.

FIG. 9A is a circuitry diagram of a refresh timer which is disposed in the semiconductor integrated circuit apparatus according to the third preferred embodiment of the present invention. The refresh timer shown in FIG. 9A is formed by the leak monitoring circuit which includes the auxiliary transistors of the second preferred embodiment, a pulse generating circuit according to the present embodiment, and a driver circuit which serves as control means for controlling the leak monitoring circuit. Hence, the same reference signs are assigned to the same elements of the leak monitoring circuit of FIG. 7 to omit a similar description, and therefore, the pulse generating circuit will be mainly described.

The pulse generating circuit is formed by a latch circuit 40 which is set by the detection signal received from the leak monitoring circuit, and a timer circuit 41 for outputting an oscillation signal which serves as the refresh signal in response to a signal which the latch circuit 40 outputs when the latch circuit 40 is set, and for outputting a signal which resets the latch circuit 40 upon finishing to output the oscillation signal for a predetermined number of times, so that the latch circuit 40 is reset by this signal and the timer circuit 41 then stops outputting the oscillation signal in response to an output signal from the latch circuit 40.

The timer circuit 41 is formed by an oscillation circuit 42 for outputting the oscillation signal in response to an output from the latch circuit 40 which is set by an output from the leak monitoring circuit, and a counter circuit 43 for counting the number of oscillations and outputting a reset signal to the latch circuit 40 when an oscillation count reaches a predetermined count.

Now, a description will be given on a basic circuit operation of the refresh timer which has such a structure as described above, with reference to the timing chart shown in FIG. 9B. First, at a time t1, the storage node 12 of the leak monitoring circuit is charged up to the potential $V_{CC}$ which is supplied from the first power source 15A, through the transistor 13. While the storage nod 12 is charge up, the timer circuit 41 outputs a pulse signal which serves as the refresh signal to an output terminal OUT, from the oscillation circuit 42, and the counter circuit 43 counts the number of oscillations of the pulse signal. At the same time, the memory cell array of the main memory side is refreshed, in synchronization to the pulse signal which is outputted from the timer circuit 41. Next, at a time t2, after oscillating for the number of times needed to refresh all memory cells of the memory cell array of the main memory side, the counter circuit 43 outputs a signal to reset the latch circuit 40, whereby the oscillation circuit 42 stops oscillating (suspend of refreshing).

Following this, when the latch circuit 40 is reset, a driver circuit 44 receiving the reset signal turns off the transistor 13 of the leak monitoring circuit to separate the storage node 12 from the first power source 15A, and at the same time the auxiliary transistor 30 is turned off to separate the cell plate 14 from the second power source 31A. As described in relation to the second preferred embodiment, the transistor 13 and the auxiliary transistor 30 are preferably controlled separately.

Next, a charge held at the storage node 12 gradually decreases because of the junction leak of the transistor 13, whereby a potential at the storage node 12 starts decreasing. As described with reference to FIG. 3, and as denoted by a curve 45, the quantity of a potential fall at the storage node 12 is larger than in the conventional leak monitoring circuit which is expressed by a dotted line 46, which means that a margin for the reference potential $V_{REF}$ is large. When the potential at the storage node 12 decreases to the reference potential $V_{REF}$ at a time t3, the latch circuit 40 is set by the output signal from the potential comparing circuit 16, whereby the latch circuit 40 outputs a signal. The timer circuit 41 is reset by the output signal from the latch circuit 40, so that the oscillation circuit 42 starts oscillating and the counter circuit 43 starts counting the number of oscillations (start of refreshing).

Meanwhile, the output signal from the latch circuit 40 turns on the transistor 13 and the auxiliary transistor 30 of the leak monitoring circuit, whereby the potential at the storage node 12 is, again, charged up to the potential $V_{CC}$ which is supplied from the first power source 15A. In this manner, the refreshing period and the refreshing suspend period are alternately repeated.

Thus, in the refresh timer according to the present embodiment, by accelerating the potential decrease speed of the storage node 12 within the leak monitoring circuit so that the speed becomes close to the potential decrease speed of the storage node of the memory cell which has the shortest data holding time, it is possible to set the refreshing intervals in accordance with the data holding time. Of course, if the leak monitoring circuit and the pulse generating circuit according to the other preferred embodiments or the other modifications are disposed in the leak monitoring circuit, it is possible to set the refreshing intervals as further optimized intervals.

(Fourth Preferred Embodiment)

Now, a fourth preferred embodiment of the present invention will be described in the following, with reference to the drawings.

Figure 10A:
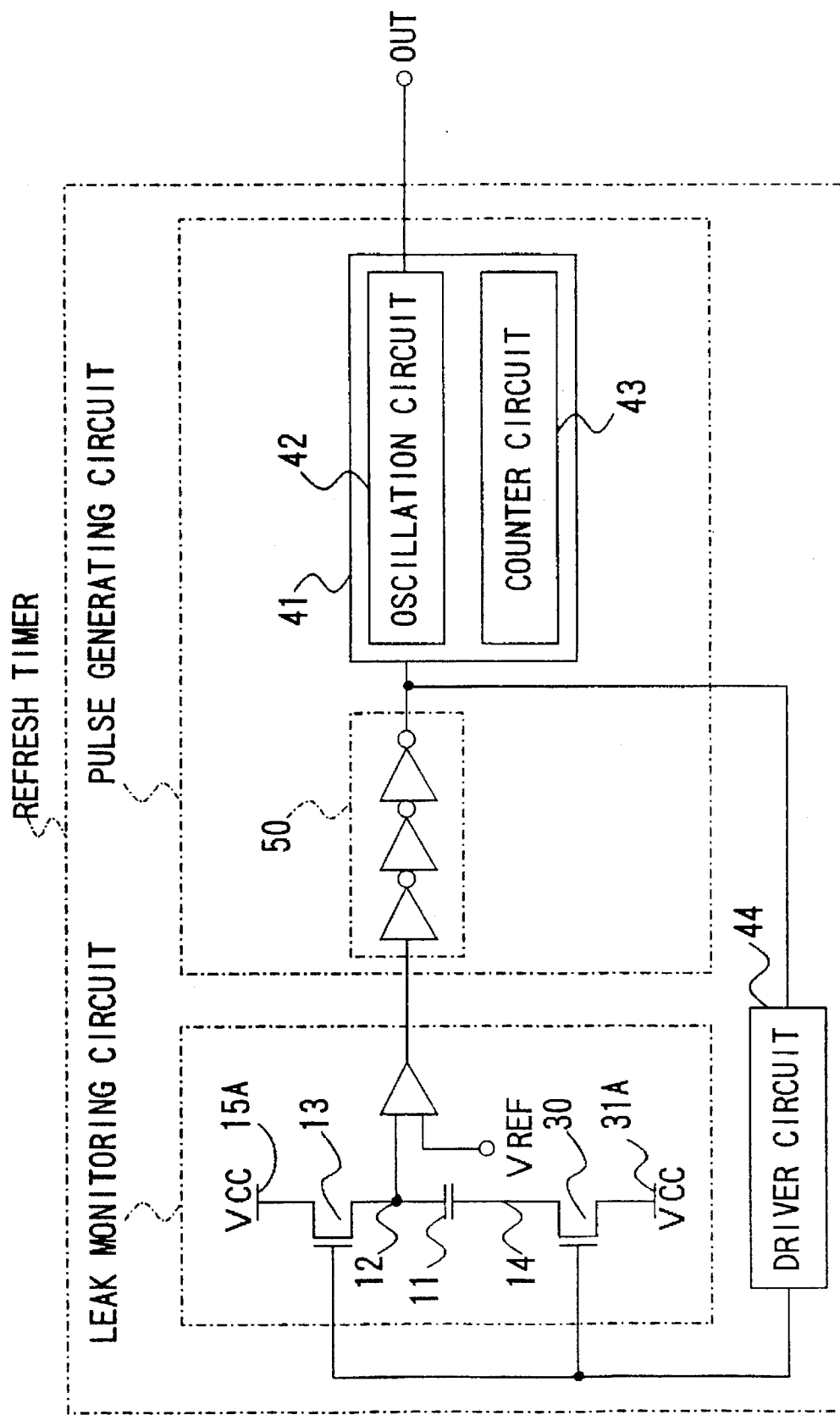
FIG. 10A is a circuitry diagram of a refresh timer which is disposed in the semiconductor integrated circuit apparatus according to a fourth preferred embodiment of the present invention.

FIG. 10A is a circuitry diagram of a refresh timer which is disposed in the semiconductor integrated circuit apparatus according to the fourth preferred embodiment of the present invention. The refresh timer shown in FIG. 10A is formed by the leak monitoring circuit which includes the auxiliary transistors of the second preferred embodiment, a pulse generating circuit according to the present embodiment, and a driver circuit which serves as control means for controlling the leak monitoring circuit. Hence, the same reference signs are assigned to the same elements of the leak monitoring circuit of FIG. 7 to omit a similar description, and therefore, the pulse generating circuit will be mainly described.

The pulse generating circuit is formed by a delay circuit 50 for receiving the detection signal, which is outputted by the potential comparing circuit 16 when the potential comparing circuit 16 detects the reference potential $V_{REF}$, for delaying the detection signal and for reversing the detection signal, the oscillation circuit 42 for outputting the pulse signal which serves as the refresh signal in response to the signal from the delay circuit 50, and the counter circuit 48 for counting the number of the pulse signal to a predetermined count.

Now, a description will be given on an operation of the refresh timer which has such a structure as described above, with reference to the timing chart shown in FIG. 10B. First, when a potential at the storage node 12 of the leak monitoring circuit decreases to the reference potential $V_{REF}$ at a time t1, the potential comparing circuit 16 outputs the detection signal. The detection signal is supplied to the delay circuit 50 of the pulse generating circuit. An output signal which is delayed by the delay circuit 50 is supplied to the oscillation circuit 42 at a time t2 so that the oscillation circuit 42 outputs the pulse signal to the output terminal OUT and also to the gate electrode of the transistor 18 of the auxiliary transistor 30 of the leak monitoring circuit through the driver circuit 44. This allows the storage node 12 to be charged up to the potential $V_{CC}$ once again by a time t3, thereby stopping outputting of the detection signal from the leak monitoring circuit. That is, the delay circuit 50 latches an output from the leak monitoring circuit and generates a pulse width of a delayed time t4, whereby a charging time of the storage node 12 is defined. An operation cycle t of the leak monitoring circuit is the sum of twice an outputting time during which the output signal is outputted (t4×2) and a potential decrease time t5 during which a potential at the storage node 12 decreases to the reference potential $V_{REF}$.

An output from the delay circuit 50 triggers the oscillation circuit 42 to oscillate, so that the refresh timer outputs a signal. In synchronization to this signal, the word lines of the memory cell array of the main memory side are serially selected, whereby refreshing is performed. An output from the leak monitoring circuit may be connected directly to the oscillation circuit 42.

The counter circuit 43 is connected to the oscillation circuit 42. When the oscillation circuit 42 finishes oscillating for a predetermined number of times corresponding to the number of the word lines, the counter circuit 43 stops the oscillation circuit 42, thereby terminating refreshing. In this case, refreshing is performed in the intensive refreshing mode, which requires refreshing to be performed intensively during a part of the operation cycle t of the leak monitoring circuit.

The delayed time t4 which is created by the delay circuit 50 only has to be long enough to trigger the oscillation circuit 42, and therefore, the delayed time t4 may not be accurate.

If the delayed time t4 which is created by the delay circuit 50 is longer than a time which is necessary to refresh all word lines, using an output from the leak monitoring circuit or the delay circuit 50 as an enable signal outputted from the oscillation circuit 42, the counter circuit 48 may be eliminated. The oscillation circuit 42 keeps oscillating while the enable signal is received.

Thus, in the refresh timer according to the present embodiment, by accelerating the potential decrease speed of the storage node 12 in the leak monitoring circuit so that the speed becomes close to the potential decrease speed of the storage node of the memory cell which has the shortest data holding time, it is possible to set the refreshing intervals in accordance with the data holding time. Of course, if the leak monitoring circuit and the pulse generating circuit according to the other preferred embodiments or the other modifications are disposed in the leak monitoring circuit, it is possible to set the refreshing intervals as further optimized intervals.

(First Modification of Fourth Preferred Embodiment)

Now, a first modification of the fourth preferred embodiment of the present invention will be described in the following, with reference to the drawings.

Figure 11A:
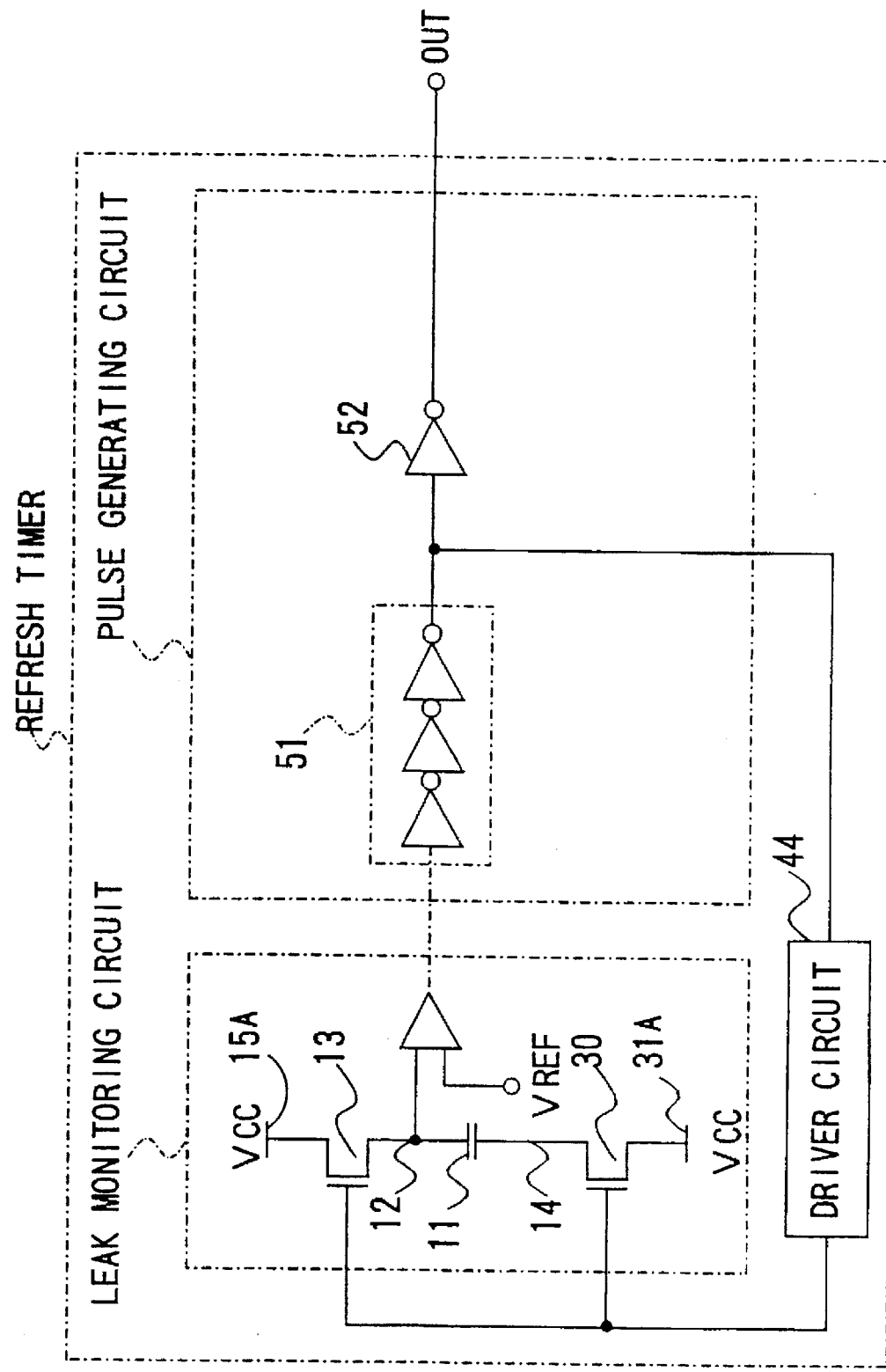
FIG. 11A is a circuitry diagram of a refresh timer which is disposed in the semiconductor integrated circuit apparatus according to a first modification of the fourth preferred embodiment of the present invention.

FIG. 11A is a circuitry diagram of a refresh timer which is disposed in the semiconductor integrated circuit apparatus according to the present modification. The refresh timer shown in FIG. 11A is formed by the leak monitoring circuit which includes the auxiliary transistors of the second preferred embodiment, a pulse generating circuit according to the present embodiment, and a driver circuit which serves as control means for controlling the leak monitoring circuit. Hence, the same reference signs are assigned to the same elements of the leak monitoring circuit of FIG. 7 to omit a similar description, and therefore, the pulse generating circuit will be mainly described.

The pulse generating circuit is formed by a delay circuit 51 for receiving the detection signal, which is outputted by the potential comparing circuit 16 when the potential comparing circuit 16 detects the reference potential $V_{REF}$, for delaying the detection signal and for reversing the detection signal, and a reversing circuit 52 for reversing a signal which is outputted from the delay circuit 51 and for outputting the refresh signal.

Next, a description will be given on an operation of the refresh timer according to the present modification with reference to FIG. 11B, while comparing the same with the operation of the refresh timer according to the fourth preferred embodiment.

When the potential decrease speed of the storage node 12 is fast and the operation cycle t of the leak monitoring circuit can be set shorter than the upper limit of the refreshing cycle, the distributed refreshing mode, in which the word lines are selected in synchronization to an output from the leak monitoring circuit, can be applied to the leak monitoring circuit shown in FIG. 11A. That is, when the refresh timer outputs an output with the outputting cycle t of the leak monitoring circuit synchronized to the outputting cycle $t_{REF}$ of the refresh timer, the word lines are serially selected so that refreshing is performed.

Now, the intensive refreshing mode according to the fourth preferred embodiment and the distributed refreshing mode according to the present modification will be compared with a case where the refreshing intervals are set equal for one word line. The refreshing cycle from selecting of one word line until selecting of the next word line is shorter in the intensive refreshing mode, since there is a refreshing suspend period in the intensive refreshing mode. Since this causes heat generation when the circuit operates, as the refreshing cycle is shorter, more heat is generated. Although average quantities of generated heat are equal because of the equal refreshing intervals set for one word line, since heat generation concentrates in the intensive refreshing mode, an increase in the temperature of the device is larger in the intensive refreshing mode.

Since the data holding characteristic is better as the temperature is lower, the refreshing intervals can be set longer in the distributed refreshing mode. This allows a further reduction in the consumption power.

Further, the present modification does not require the oscillation circuit nor the counter circuit unlike in the pulse generating circuits according to the other preferred embodiments. Therefore, the size of the pulse generating circuit is reduced in the present modification.

(Fifth Preferred Embodiment)

Now, a fifth preferred embodiment of the present invention will be described in the following.

When a mode to be used controls refreshing from outside the apparatus, the data holding characteristic of the device must comply with standards which are set to define the refreshing cycle. Hence, in the self-refreshing mode as well, the device can hold correct data as far as the refreshing cycle is within a standard value. In a mode corresponding to 4 k-refreshing of a 16M DRAM, for instance, since a refreshing cycle is standardized as 64 ms, the refresh timer according to the present invention only has to realize a refreshing cycle of 64 ms or shorter under the worst temperature condition. As described with reference to FIG. 16, different ones of the dummy memory cells used in the present invention have different leak characteristics since different memory cells have different leak characteristics, and therefore, different devices have different refreshing cycles. The refreshing cycle can be extended or shortened when the refreshing cycle adjusting circuit shown in FIG. 8 is used. First, the cycle of the refresh signal which is generated by the refresh timer is measured for each device under the worst temperature condition, and measurements are compared with a target range which is set for standard values. If measurements are not within the target range, after the refreshing cycle adjusting circuit adjusts the refreshing cycle, the cycle is measured and compared once again.

Now, a description will be given on a specific example of a refresh timer cycle adjusting method.

Figure 12:
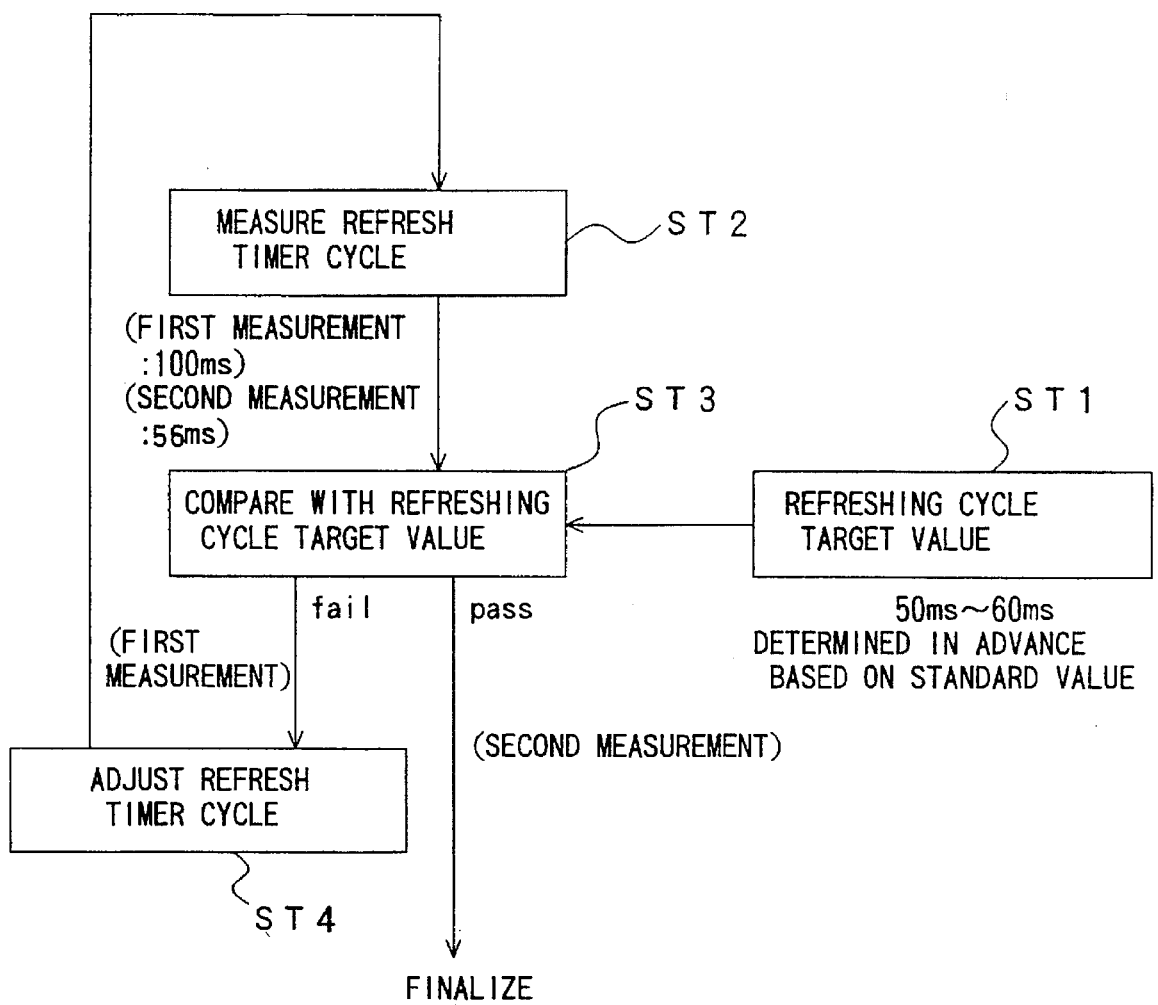
FIG. 12 is a flow chart of a refresh timer cycle adjusting method according to a fifth preferred embodiment of the present invention.

FIG. 12 is a flow chart of a refresh timer cycle adjusting method according to the fifth preferred embodiment of the present invention.

First, at Step ST1, a target value of the refreshing cycle is set as 50 to 60 ms, considering that the standard value is 64 ms. Of course, the target value only has to satisfy the standard value. Although the range set here does not have to be strictly satisfied, as the target value is closer to the standard value, the present invention yields a greater effect of reducing a consumption current which is required by refreshing.

Next, at Step ST2, the cycle of the refresh signal which is outputted by the refresh timer is measured for each device under the worst temperature condition.

Following this, at Step ST3, if a measurement result obtained by the first measurement on a certain device is 100 ms, this measurement value is compared with the target value and rejected.

Next, at Step ST4, the refreshing cycle is adjusted to decrease, by trimming a fuse of the introductory capacitor which is disposed within the dummy memory cell of the leak monitoring circuit of the refresh timer of the rejected device.

Step ST2 is then repeated. Confirming that a measurement result obtained by the second measurement on the fine-adjusted device is 56 ms, the measurement result obtained by the second measurement is compared with the target value and accepted at the comparing step ST3.

Of course, measuring may be repeated after trimming a fuse, if a result of re-measuring is outside the target range.

According to the present embodiment, it is possible to hold data even under the worst temperature condition, and to realize a refresh timer in which the refreshing cycle can be extended at a normal temperature or at a low temperature in accordance with the holding characteristics of the memory cells.

The target value for the refreshing cycle may be set in accordance with inspection standards. That is, standard values set for inspection of holding characteristics are set high in general within such a range which does not deteriorate a yield, so as to be margin-free with respect to external refresh standard values. Hence, when the refresh timer cycle is determined in accordance with inspection standards, a consumption current associated with refreshing is further reduced.

(First Modification of Fifth Preferred Embodiment)

Now, a first modification of the fifth preferred embodiment of the present invention will be described in the following.

While a refreshing cycle controlled outside the apparatus is standardized to a specific cases, to a real device, in some cases, the holding characteristics may be exceptionally good so that the refreshing cycle may be set ten or more times as large as the standard value without making it impossible to hold data.

In light of this, the present modification requires to measure a holding characteristic of each device and set a target value for a refresh timer cycle based on the measurement.

Now, a specific example of a refresh timer cycle adjusting method will be described with reference to the drawings.

Figure 13:
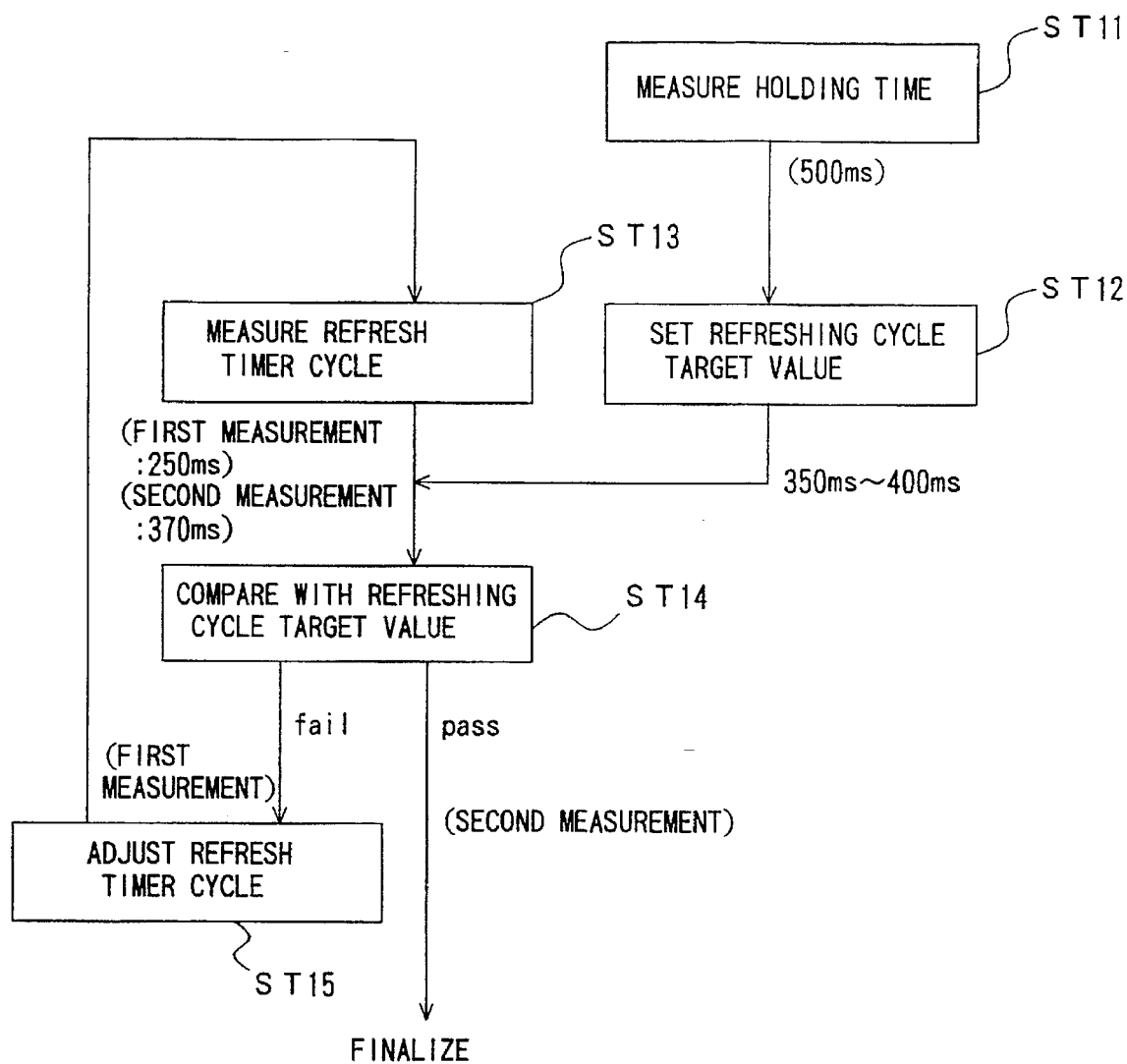
FIG. 13 is a flow chart of a refresh timer cycle adjusting method according to a first modification of the fifth preferred embodiment of the present invention.
Figure 14:
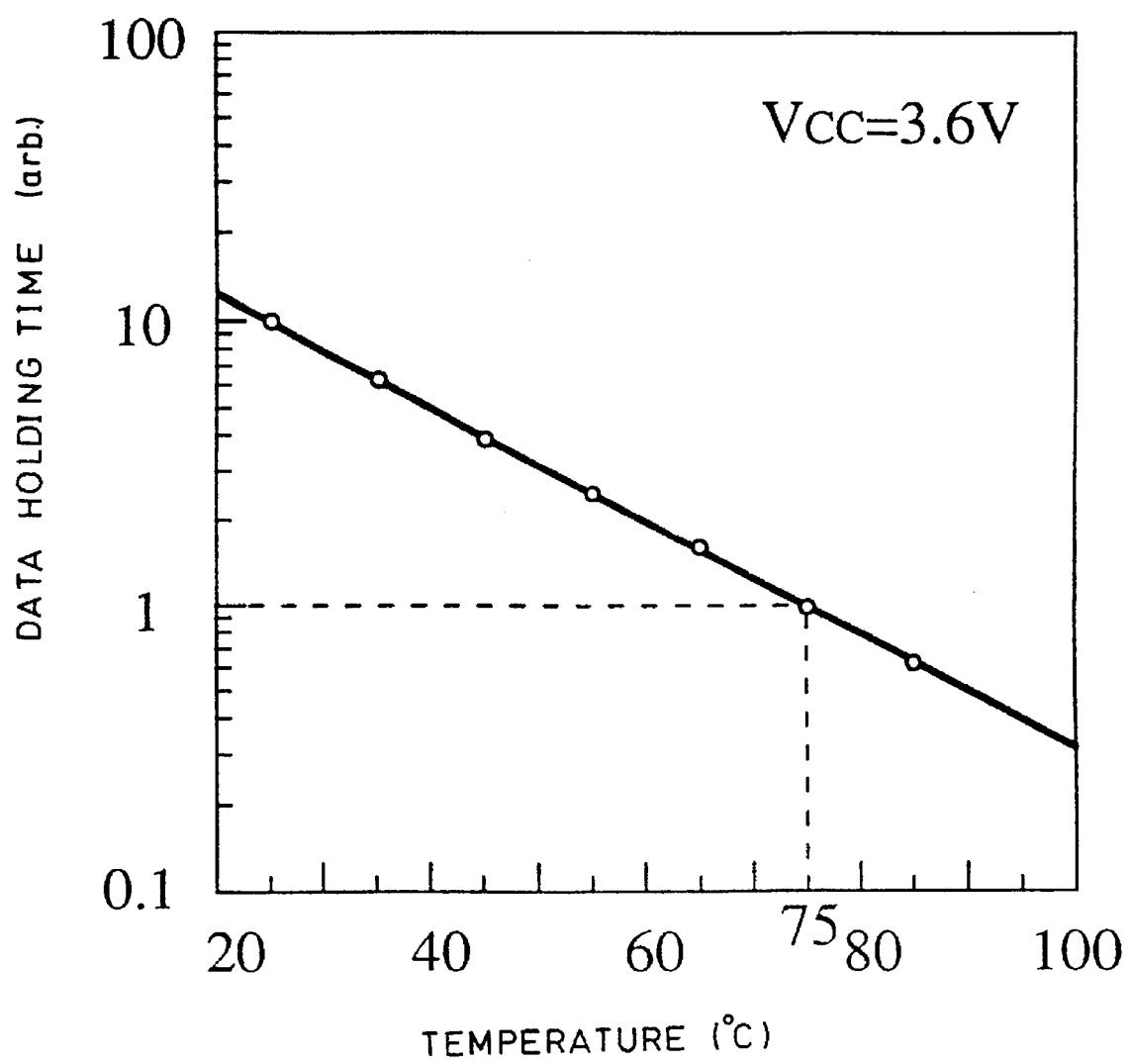
FIG. 14 is a view showing a temperature-dependency of a data holding time of a DRAM memory cell.
Figure 15A:
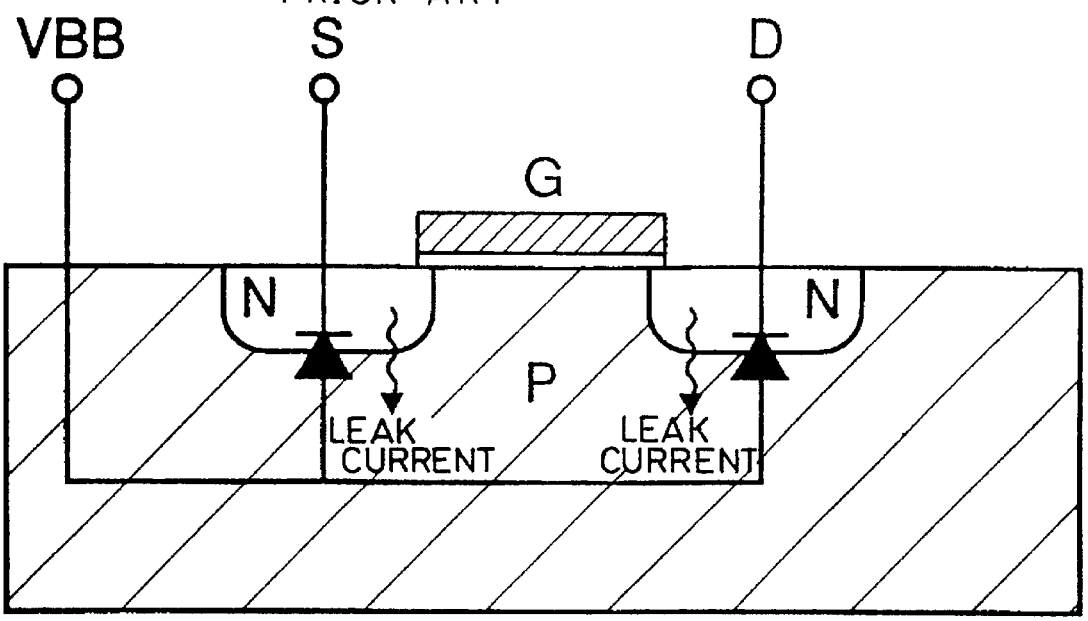
FIG. 15A is a schematic cross sectional view of an NMOS transistor, showing a leak current at a PN junction.
Figure 15B:
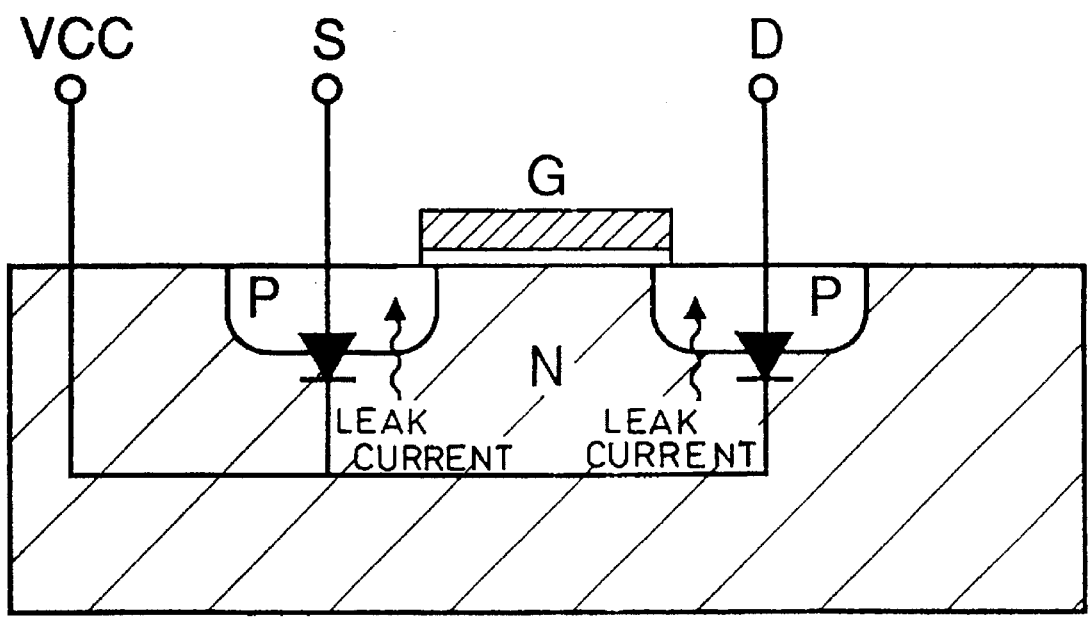
FIG. 15B is a schematic cross sectional view of a PMOS transistor, showing a leak current at a PN Junction.

FIG. 13 is a flow chart of a refresh timer cycle adjusting method according to the present modification.

First, at Step ST11, it is assumed that a measured data holding time of a certain device is 500 ms.

Next, at Step ST 12, including a margin, a target value 1s set as 350 to 400 ms, based on the measurement 500 ms.

At Step ST13, a refresh timer cycle of a device which is the same as the measured device is then measured.

Following this, at Step ST14, If a measurement result obtained by the first measurement on a certain device is 250 ms, this measurement value is compared with the target value and rejected.

Next, at Step ST15, the refreshing cycle is adjusted to increase, by trimming a fuse of the introductory capacitor which is disposed within the dummy memory cell of the leak monitoring circuit of the refresh timer of the rejected device.

Step ST13 is repeated. Confirming that a measurement result obtained by the second measurement on the fine-adjusted device is 370 ms, the measurement result obtained by the second measurement is compared with the target value at the comparing step ST14. Since the measurement result obtained by the second measurement is within the target range, the device is determined acceptable.

It is possible to set optimal refreshing intervals for each device, according to this method. Further, since it is only necessary that the temperature condition for measurement of the data holding time at Step ST11 is the same as the temperature condition for measurement on the refresh timer cycle at Step ST13, it is unnecessary to measure the refresh timer cycle under the worst temperature condition or to adjust the refresh timer cycle. This makes management of the temperature easy.

What is claimed is:

1. A semiconductor integrated circuit apparatus, comprising:

a memory cell array of a main memory which is formed by arranging memory cells, each formed by a capacitor and a transistor, the capacitor being formed by disposing a first electrode which serves as a storage node storing a charge and a second electrode which is connected to a cell plate in such a manner that the first electrode and the second electrode face each other, the transistor having a first electrode connected to said storage node, a second electrode connected to a first power source which supplies a charge to said first electrode of said capacitor, and a third electrode connected to a control line which controls the quantity of a charge at said capacitor; and a refresh timer which outputs a refresh signal for holding data in the memory cell array of the main memory, wherein the refresh timer is comprised of:

leak monitoring means which detects a voltage drop associated with a leak current from the memory cell array; and pulse generating means which receives a detection signal outputted from the leak monitoring means and outputs said refresh signal while at the same time outputting a signal to control means which controls said leak monitoring means, the leak monitoring means comprises:

a dummy memory cell array which is formed by arranging memory cells which have the same structure as the memory cells which form said memory cell array of the main memory, the memory cells of the dummy memory cell array each having said third electrode of said transistor connected to said control means, said dummy memory cell array creating a voltage drop associated with said leak current;

potential comparing means which is connected to storage nodes or cell plates of the memory cells which form the dummy memory cell array, the potential comparing means comparing a potential generated by said dummy memory cell array with a predetermined potential and outputting a signal when said potential coincides with said predetermined potential; and leak accelerating means for accelerating a voltage drop within said memory cells which form said dummy memory cell array.

2. The semiconductor integrated circuit apparatus of claim 1, wherein said potential comparing means is connected to the cell plates of said memory cells which form said dummy memory cell array.

3. The semiconductor integrated circuit apparatus of claim 1, wherein in said leak monitoring means, the cell plates of said memory cells which form said dummy memory cell array are electrically open.

4. The semiconductor integrated circuit apparatus of claim 3, wherein the transistors of said memory cells are N type MOS transistors, and in said leak monitoring means, said dummy memory cell array is connected to a voltage increasing power source which supplies a higher potential than said first power source which is applied to the memory cell array of said main memory.

5. The semiconductor integrated circuit apparatus of claim 3, wherein the transistors of said memory cells are N type MOS transistors, and in said leak monitoring means, substrates of said N type MOS transistors of said dummy memory cell array are connected to a voltage decreasing power source which supplies a lower potential than a power source which is connected to substrates of said N type MOS transistors of the memory cell array of said main memory.

6. The semiconductor integrated circuit apparatus of claim 3, wherein at least one introductory capacitor, which has one electrode connected through a fuse and the other electrode grounded, is connected to at least said storage nodes or said cell plates of said dummy memory cell array side, and the value of a capacitance coupled to said storage nodes is adjusted by cutting said fuse.

7. The semiconductor integrated circuit apparatus of claim 3, wherein at least one introductory transistor, which has a first electrode connected through a fuse, a second electrode connected to said first power source, and a third electrode connected to said control means, is connected to at least said storage nodes or said cell plates of said dummy memory cell array, and the potential decrease speeds of said storage nodes are adjusted by cutting said fuse.

8. The semiconductor integrated circuit apparatus of claim 1, wherein said leak accelerating means is an auxiliary transistor which has a first electrode connected to the cell plates of said memory cells which form said dummy memory cell array, a second electrode connected to a second power source, and a third electrode connected to said control means.

9. The semiconductor integrated circuit apparatus of claim 8, wherein a potential at said second power source is equal to a potential at said first power source.

10. The semiconductor integrated circuit apparatus of claim 8, wherein the transistors of said memory cells are N type MOS transistors, and in said leak monitoring means, said dummy memory cell array is also connected to a voltage increasing power source which supplies a higher potential than said first power source which is applied to the memory cell array of said main memory.

11. The semiconductor integrated circuit apparatus of claim 8, wherein the transistors of said memory cells are N type MOS transistors, and in said leak accelerating means, substrates of said N type MOS transistors of said dummy memory cell array are connected to a voltage decreasing power source which supplies a lower potential than a power source which is connected to substrates of said N type MOS transistors of the memory cell array of said main memory.

12. The semiconductor integrated circuit apparatus of claim 8, wherein at least one introductory capacitor, which has one electrode connected through a fuse and the other electrode grounded, is connected to at least said storage nodes or said cell plates of said dummy memory cell array side, and the value of a capacitance coupled to said storage nodes is adjusted by cutting said fuse.

13. The semiconductor integrated circuit apparatus of claim 8, wherein at least one introductory transistor, which has a first electrode connected through a fuse, a second electrode connected to said first power source, and a third electrode connected to said control means, is connected to at least said storage nodes or said cell plates of said dummy memory cell array, and the potential decrease speeds of said storage nodes are adjusted by cutting said fuse.

14. The semiconductor integrated circuit apparatus of claim 8, wherein said control means separately controls an operation of said transistors of said dummy memory cell array and an operation of said auxiliary transistor.

15. The semiconductor integrated circuit apparatus of claim 1, wherein said pulse generating means comprises:

signal latching means which is connected to said potential comparing means and said control means, said signal latching means holding a received signal; and timer means which is connected to said signal latching means, said timer means being formed by oscillating means for outputting pulses which serve as said refresh signal and a counter for counting the pulses to a predetermined count.

16. The semiconductor integrated circuit apparatus of claim 1, wherein said pulse generating means comprises delaying means which is connected to said potential comparing means and said control means, said delaying means delaying a received signal.

17. The semiconductor integrated circuit apparatus of claim 1, wherein said pulse generating means outputs all of said refresh signals, intensively during a part of a refreshing cycle period which is a generation period for generating said detection signal.

18. The semiconductor integrated circuit apparatus of claim 1, wherein said pulse generating means outputs said refresh signal which is synchronized to a generation period for generating said detection signal.

19. A refresh timer cycle adjusting method, comprises:

a measuring step of measuring a timer cycle of a refresh timer which outputs a refresh signal for holding data in memory cell array, the refresh timer comprising leak monitoring means which detects a voltage drop associated with a leak current in said memory cell array and refreshing cycle adjusting means for adjusting the timer cycle for which the refresh signal is output; an evaluating step of comparing the thus measured timer cycle with a predetermined target value of the timer cycle of said refresh timer which is set based on a standard value regarding a device which forms the memory cell array and thereafter evaluating whether the measured timer cycle reaches the predetermined target value; and an adjusting step of adjusting the refreshing cycle adjusting means when the measurement does not reach the target value which is set for evaluation.

20. The refresh timer cycle adjusting method of claim 19, wherein said adjusting step comprises a step of repeating steps from said measuring step to said adjusting step until said target value is reached.

21. The refresher timer cycle adjusting method of claim 19, wherein said refresh timer cycle adjusting means is formed by connecting at least one introductory capacitor, which has one electrode connected through a fuse and another electrode grounded, to at least storage nodes or cell plates of dummy memory cells, within said leak monitoring means which comprises said dummy memory cells each formed by a capacitor and a transistor, said capacitor being formed by disposing a first electrode which serves as said storage node for accumulating a charge and a second electrode which is connected to a cell plate so that the electrodes face each other, said transistor being connected between said storage node and a power source which supplies a charge to said storage node and controlling the quantity of charges accumulated at said storage node, and an adjusting method performed at said adjusting step requires to cut said fuse.

22. The refresh timer cycle adjusting method of claim 19, wherein said refresh timer cycle adjusting means is formed by connecting at least storage nodes or cell plates of dummy memory cells, within said leak monitoring means which comprises said dummy memory cells each formed by a capacitor and a transistor, said capacitor being formed by disposing a first electrode which serves as said storage node for accumulating a charge and a second electrode which is connected to a cell plate so that the electrodes face each other, said one introductory transistor having a first electrode connected through a fuse, a second electrode connected to said power source, and a third electrode connected to control means which controls the quantity of charges accumulated at said capacitor, said transistor being connected between said storage node and a power source which supplies a charge to said storage node and controlling the quantity of charges accumulated at said storage node, and an adjusting method performed at said adjusting step requires to cut said fuse.

23. A refresh timer cycle adjusting method, comprises:

a preparation step of measuring a data holding time of a device which forms a memory cell array under a predetermined condition of temperature and for thereafter setting a target value from a measurement;

a measuring step of measuring a timer cycle of a refresh timer which outputs a refresh signal for holding data in said memory cell array, under the same condition as at the preparation step, the refresh timer comprising leak monitoring means which detects a voltage drop associated with a leak current in said memory cell array and refreshing cycle adjusting means for adjusting the timer cycle for which the refresh signal is output;

an evaluating step of comparing a predetermined target value with which is set at said preparation step a measurement which is obtained at said measuring step and for thereafter evaluating whether the measurement which is obtained at said measuring step reaches the target value; and an adjusting step of adjusting the refreshing cycle adjusting means when the measurement does not reach the target value which is set for evaluation.

24. The refresh timer cycle adjusting method of claim 23, wherein said adjusting step comprises a step of repeating steps from said measuring step to said adjusting step until said target value is reached.

25. The refresh timer cycle adjusting method of claim 23, wherein said refresh timer cycle adjusting means is formed by connecting least one introductory capacitor, which has one electrode connected through a fuse and the another electrode grounded, to at least storage nodes or cell plates of said dummy memory cells, within said leak monitoring means which comprises dummy memory cells each formed by a capacitor and a transistor, said capacitor being formed by disposing a first electrode which serves as said storage node for accumulating a charge and a second electrode which is connected to a cell plate so that the electrodes face each other, said transistor being connected between said storage node and a power source which supplies a charge to said storage node and controlling the guantity of charges accumulated at said storage node, and an adjusting method performed at said adjusting step requires to cut said fuse.

26. The refresh timer cycle adjusting method of claim 23, wherein said refresh timer cycle adjusting means is formed by connecting at least one introductory transistor to at least storage nodes or cell plates of dummy memory cells, within said leak monitoring means which comprises said dummy memory cells each formed by a capacitor and a transistor, said capacitor being formed by disposing a first electrode which serves as said storage node for accumulating a charge and a second electrode which is connected to a cell plate so that the electrodes face each other, said one introductory transistor having a first electrode connected through a fuse, a second electrode connected to said power source, and a third electrode connected to control means which controls the quantity of charges accumulated at said capacitor, said transistor being connected between said storage node and a power source which supplies a charge to said storage node and controlling the quantity of charges accumulated at said storage node, and an adjusting method performed at said adjusting step requires to cut said fuse.

27. The refresh timer cycle adjusting method of claim 19, wherein said refresh timer has a temperature dependency equivalent to that in data-holding characteristics of memory cells composing said memory cell array.

28. A semiconductor integrated circuit apparatus, comprising:
a memory cell array of main memory; and
a refresh timer which outputs a refresh signal for holding data in the memory cell array of the main memory,
wherein the refresh timer is comprised of:
leak monitoring means which detects a voltage drop associated with a leak current from the memory cell array; and
pulse generating means which receives a detection signal outputted from the leak monitoring means and outputs said refresh signal while at the same time outputting a signal to control means which controls said leak monitoring means,
the leak monitoring means comprises:
a dummy memory cell array which is formed by arranging memory cells which have the same structure as the memory cells which form said memory cell array of the main memory,
potential comparing means for comparing a potential generated by said dummy memory cell array with a predetermined potential and outputting a signal when said potential coincides with said predetermined potential; and
leak accelerating means for accelerating a voltage drop within said memory cells which form said dummy memory cell array.

29. The semiconductor integrated circuit apparatus of claim 28, wherein said potential comparing means is connected to the cell plates of said memory cells which form said dummy memory cell array.

30. The semiconductor integrated circuit apparatus of claim 28, wherein in said leak monitoring means, the cell plates of said memory cells which form said dummy memory cell array are electrically open.

31. The semiconductor integrated circuit apparatus of claim 30, wherein the transistors of said memory cells are N type MOS transistors, and in said leak monitoring means, said dummy memory cell array is connected to a voltage increasing power source which supplies a higher potential than said first power source which is applied to the memory cell array of said main memory.

32. The semiconductor integrated circuit apparatus of claim 30, wherein the transistors of said memory cells are N type MOS transistors, and in said leak monitoring means, substrates of said N type MOS transistors of said dummy memory cell array are connected to a voltage decreasing power source which supplies a lower potential than a power source which is connected to substrates of said N type MOS transistors of the memory cell array of said main memory.

33. The semiconductor integrated circuit apparatus of claim 30, wherein at least one introductory capacitor, which has one electrode connected through a fuse and the other electrode grounded, is connected to at least storage nodes storing a charge or said cell plates of said dummy memory cell array side, and the value of a capacitance coupled to said storage nodes is adjusted by cutting said fuse.

34. The semiconductor integrated circuit apparatus of claim 30, wherein at least one introductory transistor, which has a first electrode connected through a fuse, a second electrode connected to said first power source, and a third electrode connected to said control means, is connected to at least storage nodes storing a charge or said cell plates of said dummy memory cell array, and the potential decrease speeds of said storage nodes are adjusted by cutting said fuse.

35. The semiconductor integrated circuit apparatus of claim 28, wherein said leak accelerating means is an auxiliary transistor which has a first electrode connected to cell plates of said memory cells which form said dummy memory cell array, a second electrode connected to a second power source, and a third electrode connected to said control means.

36. The semiconductor integrated circuit apparatus of claim 35, wherein a potential at said second power source is equal to a potential at said first power source.

37. The semiconductor integrated circuit apparatus of claim 35, wherein the transistors of said memory cells are N type MOS transistors, and in said leak monitoring means, said dummy memory cell array is also connected to a voltage increasing power source which supplies a higher potential than said first power source which is applied to the memory cell array of said main memory.

38. The semiconductor integrated circuit apparatus of claim 35, wherein the transistors of said memory cells are N type MOS transistors, and in said leak accelerating means, substrates of said N type MOS transistors of said dummy memory cell array are connected to a voltage decreasing power source which supplies a lower potential than a power source which is connected to substrates of said N type MOS transistors of the memory cell array of said main memory.

39. The semiconductor integrated circuit apparatus of claim 35, wherein at least one introductory capacitor, which has one electrode connected through a fuse and the other electrode grounded, is connected to at least storage nodes storing a charge or said cell plates of said dummy memory cell array side, and the value of a capacitance coupled to said storage nodes is adjusted by cutting said fuse.

40. The semiconductor integrated circuit apparatus of claim 35, wherein at least one introductory transistor, which has a first electrode connected through a fuse, a second electrode connected to said first power source, and a third electrode connected to said control means, is connected to at least storage nodes storing a charge or said cell plates of said dummy memory cell array, and the potential decrease speeds of said storage nodes are adjusted by cutting said fuse.

41. The semiconductor integrated circuit apparatus of claim 35, wherein said control means separately controls an operation of said transistors of said dummy memory cell array and an operation of said auxiliary transistor.

42. The semiconductor integrated circuit apparatus of claim 28, wherein said pulse generating means comprises:
signal latching means which is connected to said potential comparing means and said control means, said signal latching means holding a received signal; and
timer means which is connected to said signal latching means, said timer means being formed by oscillating means for outputting pulses which serve as said refresh signal and a counter for counting the pulses to a predetermined count.

43. The semiconductor integrated circuit apparatus of claim 28, wherein said pulse generating means comprises delaying means which is connected to said potential comparing means and said control means, said delaying means delaying a received signal.

44. The semiconductor integrated circuit apparatus of claim 28, wherein said pulse generating means outputs all of said refresh signals, intensively during a part of a refreshing cycle period which is a generation period for generating said detection signal.

45. The semiconductor integrated circuit apparatus of claim 28, wherein said pulse generating means outputs said refresh signal which is synchronized to a generation period for generating said detection signal.

* * * * *